(12) United States Patent
Okesaku et al.

(10) Patent No.: US 8,372,200 B2
(45) Date of Patent: Feb. 12, 2013

(54) SHOWER PLATE, METHOD FOR MANUFACTURING THE SHOWER PLATE, PLASMA PROCESSING APPARATUS USING THE SHOWER PLATE, PLASMA PROCESSING METHOD AND ELECTRONIC DEVICE MANUFACTURING METHOD

(75) Inventors: Masahiro Okesaku, Komatsu (JP); Tetsuya Goto, Sendai (JP); Tadahiro Ohmi, Sendai (JP); Kiyotaka Ishibashi, Minato-ku (JP)

(73) Assignees: Tokyo Electron Ltd., Tokyo (JP); National University Corporation Tohoku University, Miyagi (JP)

( * ) Notice: Subject to any disclaimer, the term of this patent is extended or adjusted under 35 U.S.C. 154(b) by 903 days.

(21) Appl. No.: 12/308,333

(22) PCT Filed: Jun. 13, 2007

(86) PCT No.: PCT/JP2007/061857
§ 371 (c)(1),
(2), (4) Date: Dec. 12, 2008

(87) PCT Pub. No.: WO2007/145229
PCT Pub. Date: Dec. 21, 2007

(65) Prior Publication Data
US 2010/0230387 A1    Sep. 16, 2010

(30) Foreign Application Priority Data

Jun. 13, 2006 (JP) ................................. 2006-163357
Jul. 20, 2006 (JP) ................................. 2006-198754
Jun. 11, 2007 (JP) ................................. 2007-153563

(51) Int. Cl.
*C23C 16/455* (2006.01)
*C23C 16/00* (2006.01)
*H01L 21/3065* (2006.01)

(52) U.S. Cl. ................ 118/715; 156/345.33; 156/345.34

(58) Field of Classification Search .................. 118/715; 156/345.33, 345.34
See application file for complete search history.

(56) References Cited

U.S. PATENT DOCUMENTS
(Continued)

FOREIGN PATENT DOCUMENTS

| EP | 1521297 A1 | 4/2005 |
|----|-----------|--------|
| JP | 09-063793 A | 3/1997 |

(Continued)

OTHER PUBLICATIONS

Translation of 2004-228426 (Sep. 2012).*

(Continued)

*Primary Examiner* — Jeffrie R Lund
(74) *Attorney, Agent, or Firm* — Pearne & Gordon LLP

(57) ABSTRACT

Occurrence of a back-flow of plasma or ignition of gas for plasma excitation in a longitudinal hole portion can be prevented more completely, and a shower plate in which efficient plasma excitation is possible is provided. In shower plate 105, which is arranged in processing chamber 102 of a plasma processing apparatus and discharges gas for plasma excitation into processing chamber, porous-gas passing body 114 having a pore that communicates in the gas flow direction is fixed onto longitudinal hole 112 used as a discharging path of gas for plasma excitation. The pore diameter of a narrow path in a gas flowing path formed of a pore, which communicates to porous-gas passing body 114, is 10 μm or lower.

7 Claims, 15 Drawing Sheets

U.S. PATENT DOCUMENTS

| | | | | |
|---|---|---|---|---|
| 4,508,054 A * | 4/1985 | Baumberger et al. | ......... | 118/718 |
| 5,439,524 A * | 8/1995 | Cain et al. | ................ | 118/723 E |
| 5,962,085 A * | 10/1999 | Hayashi et al. | .............. | 427/585 |
| 5,996,528 A * | 12/1999 | Berrian et al. | ............ | 118/723 E |
| 6,660,572 B2 * | 12/2003 | Miyasaka | ..................... | 438/149 |
| 6,793,733 B2 * | 9/2004 | Janakiraman et al. | ....... | 118/715 |
| 7,802,539 B2 * | 9/2010 | Bosch | ...................... | 118/723 E |
| 8,038,834 B2 * | 10/2011 | Funk et al. | ............... | 156/345.29 |
| 8,074,599 B2 * | 12/2011 | Choi et al. | ............... | 118/723 R |
| 8,083,891 B2 * | 12/2011 | Sato | ......................... | 156/345.47 |
| 2001/0006070 A1 * | 7/2001 | Shang et al. | ....................... | 134/1 |
| 2002/0011215 A1 * | 1/2002 | Tei et al. | ............... | 118/723 MW |
| 2003/0037880 A1 * | 2/2003 | Carducci et al. | ........ | 156/345.43 |
| 2003/0041801 A1 * | 3/2003 | Hehmann | ..................... | 118/715 |
| 2003/0089314 A1 * | 5/2003 | Matsuki et al. | .............. | 118/715 |
| 2004/0221809 A1 * | 11/2004 | Ohmi et al. | .................. | 118/715 |
| 2004/0261712 A1 * | 12/2004 | Hayashi et al. | .......... | 118/723 E |
| 2005/0082385 A1 * | 4/2005 | Kuwada et al. | ............... | 239/128 |
| 2005/0092437 A1 * | 5/2005 | Ohmi et al. | ............. | 156/345.41 |
| 2005/0109460 A1 * | 5/2005 | DeDontney et al. | ..... | 156/345.33 |
| 2007/0068625 A1 * | 3/2007 | Funk et al. | ............... | 156/345.29 |
| 2008/0206463 A1 * | 8/2008 | Grigorian et al. | ......... | 427/249.1 |
| 2009/0205782 A1 * | 8/2009 | Ohmi et al. | ............. | 156/345.34 |
| 2009/0226614 A1 * | 9/2009 | Nasman | ................... | 427/255.28 |
| 2009/0229753 A1 * | 9/2009 | Ohmi et al. | ............. | 156/345.34 |
| 2009/0229755 A1 * | 9/2009 | Ohmi et al. | ............. | 156/345.41 |
| 2009/0255631 A1 * | 10/2009 | Sato | ......................... | 156/345.43 |
| 2009/0286405 A1 * | 11/2009 | Okesaku et al. | ............ | 438/710 |
| 2009/0291563 A1 * | 11/2009 | Ishibashi | ...................... | 438/710 |
| 2009/0311869 A1 * | 12/2009 | Okesaku et al. | ............ | 438/710 |
| 2010/0025821 A1 * | 2/2010 | Ohmi et al. | .................. | 257/607 |
| 2010/0178775 A1 * | 7/2010 | Okesaku et al. | ............ | 438/726 |
| 2010/0230387 A1 * | 9/2010 | Okesaku et al. | ............... | 216/69 |
| 2010/0288439 A1 * | 11/2010 | Ishibashi et al. | ........ | 156/345.33 |
| 2011/0030898 A1 * | 2/2011 | Sato | ......................... | 156/345.24 |

FOREIGN PATENT DOCUMENTS

| | | | | |
|---|---|---|---|---|
| JP | 11-274087 | | | 10/1999 |
| JP | 2001-274151 A | | | 10/2001 |
| JP | 2002-299240 A | | | 10/2002 |
| JP | 2002-343788 A | | | 11/2002 |
| JP | 2003-045809 A | | | 2/2003 |
| JP | 2003-332326 A | | | 11/2003 |
| JP | 2003-338492 A | | | 11/2003 |
| JP | 2003338492 A | | * | 11/2003 |
| JP | 2004-039972 A | | | 2/2004 |
| JP | 2004-083362 A | | | 3/2004 |
| JP | 2004-228426 A | | | 8/2004 |
| JP | 2004228426 A | | * | 8/2004 |
| JP | 2005-033167 A | | | 2/2005 |
| SU | 954106 A | | * | 8/1982 |
| TW | 200408316 A | | | 5/2004 |
| WO | WO 03/096400 A1 | | | 11/2003 |
| WO | WO 2004/006319 A1 | | | 1/2004 |
| WO | WO2005/067022 A1 | | | 7/2005 |
| WO | WO2006/112392 A1 | | | 10/2006 |

OTHER PUBLICATIONS

KR office action of KR Patent Application No. 10-2008-7027932, issued on May 27, 2011, issued by KIPO.

Notice for a submission of opinion, KR Patent Application No. 10-2008-7027932, Dispatched on Sep. 28, 2010, Korean Intellectual Property Office.

TW office action of TW Patent Application No. 096121388, issued on Jan. 6, 2011, issued by TIPO.

Contents of First Notification of the Substantive Examination, Chinese Patent Application No. 200780021712.X, Issued on Aug. 17, 2011, State Intellectual Property Office of the People's Republic of China.

* cited by examiner

FIG. 7
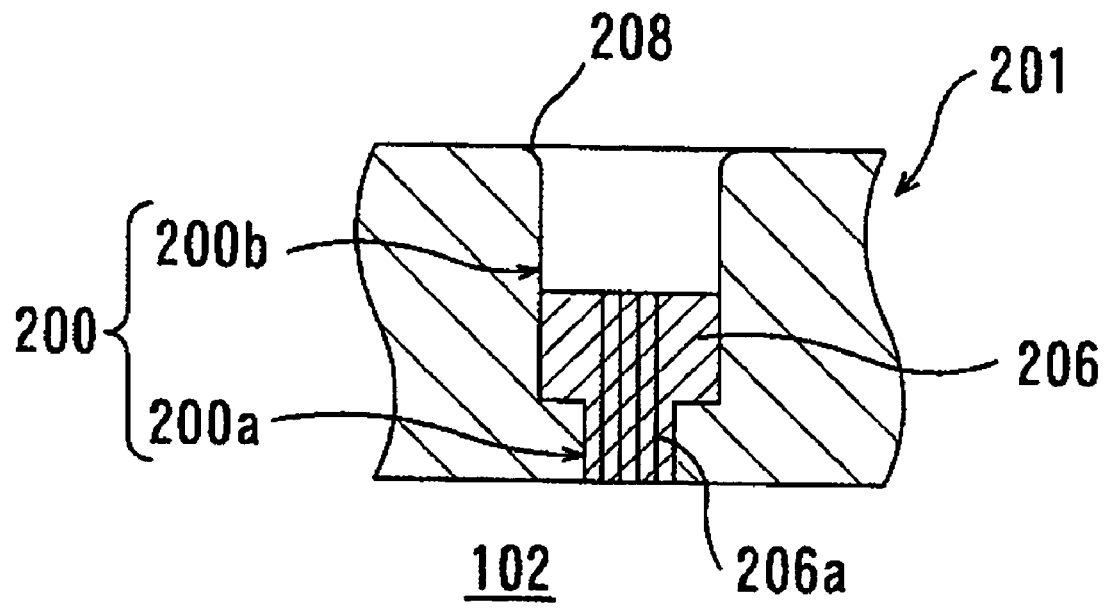
(a)
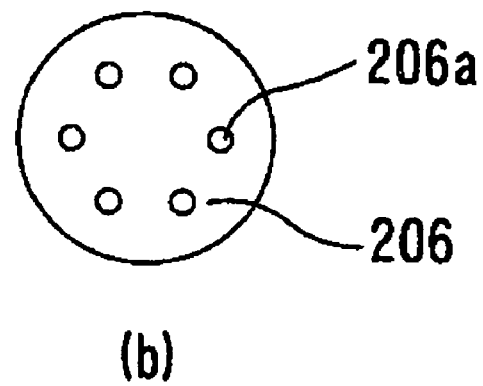
(b)

SHOWER PLATE, METHOD FOR MANUFACTURING THE SHOWER PLATE, PLASMA PROCESSING APPARATUS USING THE SHOWER PLATE, PLASMA PROCESSING METHOD AND ELECTRONIC DEVICE MANUFACTURING METHOD

This application claims priority under 35 U.S.C. §371 as a National Stage application of PCT application Serial No. PCT/JP2007/61857, filed Jun. 13, 2007, entitled "Shower Plate, Method for Manufacturing the Shower Plate, Plasma Processing Apparatus using the Shower Plate, Plasma Processing Method and Electronic Device Manufacturing Method", which claims priority to Japanese Patent Applications No. P 2006-163357 filed on Jun. 13, 2006, No. P 2006-198754 filed on Jul. 20, 2006 and No. P2007-153563 filed on Jun. 11, 2007, which are incorporated herein by reference.

TECHNICAL FIELD

A present invention relates to a plasma processing apparatus. The present invention particularly relates to a shower plate, which is used for a microwave plasma processing apparatus, a manufacturing method of the shower plate, a plasma processing apparatus using the shower plate and a plasma processing method and a manufacturing method of an electronic device.

BACKGROUND ART

A plasma treatment process and a plasma processing apparatus are the technology indispensable in manufacturing of a overly fine semiconductor device, and in manufacturing of a high resolution plane display device containing a liquid crystal display device of having a gate length of 0.1 µm or not greater than 0.1 µm, what is called a deep submicron element or a deep subquarter micron element in recent years.

Although an excitation method of more various plasma than before is used as a plasma processing apparatus used for manufacturing of a semiconductor device or a liquid crystal display device, a parallel monotonous type high frequency excitation plasma processing apparatus or an inductively-coupled plasma processing apparatus is especially common. However, plasma formation by a conventional plasma processing apparatus is uneven, and an area with high electron density is limited. Therefore, there is a problem of difficulty in performing a uniform process over the whole surface of the substrate to be processed with a high processing rate, namely, a throughput. This problem becomes particularly serious in cases when a substrate having a large diameter is processed. And in the conventional plasma processing apparatus, since electron temperature is high, a semiconductor device formed on a substrate to be processed was damaged. The conventional plasma processing apparatus also has some essential problems such as metal contamination by sputtering of a processing chamber wall is large. Therefore, the conventional plasma processing apparatus is becoming difficult to satisfy a severe requirement against the further refinement of a semiconductor device or a liquid crystal display device and improvement in further productivity.

On the other hand, a microwave plasma processing apparatus using high-density plasma excited by microwave electric field without using a direct-current magnetic field has been conventionally proposed. For example, a plasma processing apparatus having a structure for radiating microwave into a processing chamber from a planate antenna (radial line slot antenna), which has a large number of slots arranged to generate uniform microwave, for ionizing gas in a processing chamber by this microwave electric field and for exciting plasma is proposed (refer to the Patent reference No. 1). In microwave plasma excited by such technique, it is possible to realize high plasma density over a wide area directly under the antenna and to perform uniform plasma processing for a short time. And in microwave plasma formed by this technique, electron temperature is low because the plasma is excited by microwave, and damage and metal contamination of a surface to be processed can be avoided. Since uniform plasma can easily be excited also on a large area over the substrate, it can also be applied easily to a manufacturing process of a semiconductor device and a manufacturing of a large-sized liquid crystal display device using a semiconductor substrate of a large diameter.

In these plasma processing apparatuses, a shower plate provided with a plurality of longitudinal holes as a gas releasing path is usually used in order to supply gas for plasma excitation uniformly in a processing chamber. However, plasma formed directly under the shower plate may flow backwards into a longitudinal hole of the shower plate by use of the shower plate. When plasma flows backwards into the longitudinal hole, there is a problem that abnormal electric discharge and deposition of gas will occur and degradation of transmission efficiency of microwave for exciting plasma and a decline of yield will occur.

Many improvements of structure of the shower plate are proposed as a method for preventing a back-flow of this plasma into the longitudinal hole.

For example, Patent reference No. 2 discloses that it is effective to structure an aperture of a gas discharge hole arranged at the edge of the longitudinal hole to be less than two times of a sheath thickness of plasma formed directly under the shower plate. However, just making the aperture of the gas discharge hole small is not sufficient enough as a method to prevent the back-flow of plasma. Particularly, when increasing plasma density from a conventional value of about $10^{12}$ cm$^{-3}$ to about $10^{13}$ cm$^{-3}$ in order to reduce a damage and increase a processing rate, the back-flow of plasma becomes remarkable and the back-flow of plasma cannot be prevented only by controlling the aperture of the gas discharge hole. It is also difficult to form a gas discharge hole of a fine aperture in the shower plate body by hole processing, and there is also a problem of processability.

Patent reference No. 3 suggests the use of the shower plate formed by a sintered porous-ceramic body having air permeability. This tends to prevent an back-flow of plasma with a wall of many pores, which structures the sintered porous-ceramic body.

However, the shower plate, which is formed by this general sintered porous-ceramic body sintered at normal temperature and normal pressure has a large variation in the pore diameter from about several µm to several tens µm. Since a diameter of the maximum crystal is as large as about 20 µm and the texture is not uniform, when surface flatness is bad and the surface, which is exposed to plasma, is formed by the sintered porous-ceramic body, effective surface area will increase. Therefore, re-combining of an electron and ion of plasma increases, and there is a problem that electric power efficiency of plasma excitation is bad. Here, the above-mentioned patent reference 3 discloses a structure for forming an opening for gas discharge in the shower plate, which is structured by a fine alumina, attaching the general sintered porous-ceramic body sintered at normal temperature and normal pressure onto this opening and emitting gas via this sintered porous-ceramic body, instead of configuring the whole shower plate from a sintered porous-ceramic body. However, in this structure, since a general sintered porous-ceramic body sintered at normal temperature and normal pressure is used, the above-mentioned problem generated from badness of surface flatness is not solved.

Previously, in patent reference 4, applicant for this patent proposed a method for preventing a back-flow of plasma by adjustment of a diameter size of a gas discharge hole, instead of changing a structure of a shower plate. That is, while preventing the back-flow of plasma by a diameter of a gas discharge hole being less than 0.1-0.3 mm, and moreover making the diameter dimensional tolerance into accuracy of less than ±0.002 mm, variation of a discharge volume of gas is abolished.

However, when this shower plate was actually used with a microwave plasma processing apparatus on conditions in which the plasma density was increased to $10^{13}$ cm$^{-3}$, a light brown discoloration portion appeared as shown in FIG. 21. The cause of the light brown discoloration seems to be the back-flow of plasma into a space 602, into which the gas for plasma excitation is filled, which is formed between a shower plate body 600 and a cover plate 601, and the back-flow of plasma into a longitudinal hole 603 that communicates with the space 602, or is seemed to be the ignition on the gas for plasma excitation in sections of the space 602 and the longitudinal hole 603.

Patent reference No. 1: Japanese Patent Application Publication No. H09-63793
Patent reference No. 2: Japanese Patent Application Publication No. 2005-33167
Patent reference No. 3: Japanese Patent Application Publication No. 2004-39972
Patent reference No. 4: The international publication 06th/No. 112392 pamphlet

DISCLOSURE OF THE PRESENT INVENTION

Problems to be Solved by the Present Invention

An object of the present invention to the problems is to provide a shower plate that completely prevents an occurrence of a back-flow of plasma and ignition of gas for plasma excitation in a longitudinal hole portion, and that is capable of performing an efficient plasma excitation.

Means to Solve the Problems

One of the aspect of the present invention is, in a shower plate, which discharges gas for plasma excitation to generate plasma in a plasma processing apparatus, to prevent the back-flow of plasma by attaching a ceramic member, which has a porous-gas passing body with pore which communicates with in a gas flow direction and suitably has a plurality of gas discharge holes, onto a longitudinal hole used as a releasing path of gas for plasma excitation, and setting a pore diameter of the narrow path in the gas flowing path formed of the pore which communicates with in the gas flow direction in the porous-gas passing body not greater than 10 μm and at the same time to generate uniform plasma by discharging gas for plasma excitation without variation into the plasma processing apparatus.

A drastic reduction of the back-flow of plasma became realized by making the length of the gas discharge hole longer than a mean free path of an electron in the plasma processing apparatus.

A prevention of electric discharge accompanying electric field concentration of microwave in the corner and further an ignition phenomenon of gas for plasma excitation became realized by giving chamfering processing to the corner of the gas introduction side of the longitudinal hole opened in the shower plate.

Even if plasma density was increased to about $10^{13}$ cm$^{-3}$, the prevention of the back-flow of plasma becomes realized, because the pore diameter of the narrow path of the porous-gas passing body is not greater than 10 μm as mentioned above. That is, in this porous-gas passing body, although the circulation of gas is secured by a communicated pore, the gas flowing path is formed in a zig zag shape, and, moreover, narrow paths of not greater than 10 μm or preferably not greater than 5 μm are formed. On the other hand, since an electron and an ion, which comprise plasma, have straightness, even if plasma has flowed backwards to a porous-gas passing body, most part of the electron and ions collide into a wall of the pore. All the plasma collides in the narrow path section of not greater than 10 μm of the pore, and the back-flow trough the porous-gas passing body is prevented.

Here, using a sintered porous-ceramic body with air permeability for the shower plate as the porous-gas passing body, which has the pore communicating in the gas flow direction is disclosed in the above-mentioned patent reference No. 3. However, the diameter of the maximum crystal of the general sintered porous-ceramic body used in the patent reference No. 3 is not less than 20 μm. Since the pore diameter of the narrow path in the gas flowing path formed of the communicated pore exceeds at least 10 μm, an back-flow of plasma cannot be prevented completely under a condition in which the plasma density is increased to about $10^{13}$ cm$^{-3}$. As mentioned above, in a case of a general sintered porous-ceramic body whose diameter of a crystal is comparatively big, the flatness of surface is bad. And since the number of the effective surface area is large, re-combining of an electron and ion of plasma will increase. Therefore, there is a problem that electric power efficiency of plasma excitation worsens.

On the other hand, in the present invention, an back-flow of plasma is securely prevented by making the pore diameter of the narrow path not greater than 10 μm as described above against the twice (20 μm) of 0.01 mm of sheath thickness of plasma when increasing plasma density to $10^{13}$ cm$^{-3}$. Simultaneously, as it will be described later, a porous-gas passing body structured by a crystal with fine diameter and a ceramic sintered body of high purity is used. By these, surface flatness can be improved and the problem of electric power efficiency deterioration of plasma excitation caused by the increase of re-combining of an electron and ion of plasma can be solved.

That is, with regard to the porous-gas passing body, a sintered porous-ceramic body having an air permeability, which is formed by a sintered ceramic body which moreover has a fine crystal organization, the sintered porous-ceramic body being the high purity which does not contain impurities which enlarge dielectric loss, is excellent from the points, such as dielectric loss and its strength. For example, a sintered alumina system body in which high purity alumina and a little grain growth depressants, $Y_2O_3$, and mullite are blended, a sintered AlN body, sintered $SiO_2$ body, a sintered mullite body, sintered $SiN_4$ body, and a sintered SiAlON body will be listed. The size of the pore diameter is preferred to be smaller than twice of the sheath thickness of plasma formed directly under the shower plate. A diameter of the crystal is fine, and an organization is uniform without variation in size are preferred. Particularly, the material used as a porous-gas passing body should have dielectric loss of the sintered porous-ceramic body formed by alumina ceramics of not greater than $1\times10^3$ and more preferably $5\times10^{-4}$ or lower, the maximum diameter of crystal of not greater than 15 μm and more preferably, not greater than 10 μm, the average diameter of the crystal of not greater than 10 μm more preferably, not greater than 5 μm, the pore rate being within the range of 20 to 75%, the average pore diameter of not greater than 10 μm, the maximum pore diameter of not greater than 75 μm and the pore diameter of the narrow path of the gas flowing path of not greater than 10 μm. It is possible to control the surface roughness degree (Ra) of a grinding processed surface except the pore portion to be not greater than 1.5 μm by setting strength (bending strength) of a sintered porous-ceramic body to not less than 30 MPa. Thereby, bad influence accompanying badness of the surface flatness of the conventional sintered porous-ceramic body or increase of effective surface area is resolved. The sintered porous-ceramic body, which has characteristics described above, can be manufactured relatively easily from high purity $Al_2O_3$ fine powder having purity of not less than 99.9% as an example. By using such sintered porous-ceramic body, the back-flow of plasma can be prevented more securely.

Such porous-gas passing body can be arranged at the gas introduction side of the gas discharge hole provided on the gas discharge side of the longitudinal hole, or the leading edge section of a longitudinal hole.

Here, when the porous-gas passing body is provided on the gas introduction side of the gas discharge hole, the porous-gas passing body will not touch plasma directly, and will not impede the degree of flatness under the shower plate. Therefore, the problem of electric power efficiency deterioration of plasma excitation caused by the increase of the re-combining of an electron and ion of plasma can be resolved. Many characteristics, such as pressure of gas for plasma excitation for every longitudinal hole and the flow velocity, are equalized by the gas for plasma excitation being introduced into a porous-gas passing body before being introduced into the gas discharge hole. And after that, since the gas for plasma excitation is discharged from a plurality of gas discharge holes, a gas flow rate for plasma excitation for every gas discharge hole is discharged into a plasma processing apparatus constantly without variation and evenly from a wide surface of the shower plate. Therefore, uniform plasma can be efficiently generated directly under the shower plate. In other words, by arranging a porous-gas passing body having the buffer effect (buffering effect) for equalizing characteristics, such as pressure of gas for plasma excitation and the flow velocity, at the gas introduction side of a gas discharge hole, the variation of the flow velocity and of mass flow rate of gas discharged from the gas discharge hole can be abolished, and equalization of generating plasma can be attained. And, while having the advantage of efficiently generating uniform plasma directly under the shower plate as described above, the back-flow of plasma into the gas introduction side of the longitudinal hole can be prevented by the porous-gas passing body formed by a ceramic sintered body having a fine crystal organization arranged at the gas introduction side of a gas discharge hole.

In a case where the porous-gas passing body is arranged to the gas introduction side of a gas discharge hole, it is preferred to continuously provide a large gas passage hole having an aperture, which is greater than the gas discharge hole, in the gas introduction side of a porous-gas passing body. This gas passage hole acts as the path for leading gas for plasma excitation to the porous-gas passing body side from an introductory path of gas for plasma excitation, which is formed by a side hole provided in a shower plate, for example. Gas for plasma excitation can be easily led to the porous-gas passing body side, and the gas passing rate, as a whole, can be increased by making the aperture greater than an aperture of a gas discharge hole. Since fluid resistance of gas can be reduced, there are few pressure losses, they can set up pressure for supplying gas at a low level and act as energy saving.

In the present invention, at least the tip part of the longitudinal hole can also be equipped with the porous-gas passing body. As described above, in case when the porous-gas passing bodies are attached at least to the tip part of the longitudinal hole gas for plasma excitation will be emitted from the full surface of the porous-gas passing body. Therefore, characteristics, such as pressure of the gas emitted for plasma excitation and the flow velocity, are equalized. Thereby, gas for plasma excitation is discharged uniformly without variation, and it becomes possible to generate uniform plasma, which does not have a turbulent flow phenomenon, directly under a shower plate.

In this case, with regard to the shape of the porous-gas passing body, the upper surface and the undersurface may be parallel toward inside of a plasma processing apparatus. However, it is preferred that the shapes of both surface are formed into curved shapes of a convex curve or a concave curve, in other words, it is preferred that the shapes of both surfaces are formed into a shape of a convex spherical shell or a concave spherical shell. By making the surface into the curved shape as described above, stress by thermal expansion and contraction at the time of use is absorbable with deformation (bending). A crack of a shower plate equipped with a porous-gas passing body and of the porous-gas passing body itself can also be prevented. Since gas for plasma excitation can be more widely emitted in cases where the surface is made into the shape of a convex curve toward inside of a plasma processing apparatus, it becomes possible to generate more uniform plasma.

The perimeter except for the upper surface and the undersurface of a porous-gas passing body may be formed by a fine ceramic layer. When fixing the porous-gas passing body to the longitudinal hole of the shower plate, since there is a possibility that the perimeter may collapse and particles may drop out, cautions are required. However, by making the perimeter into a fine ceramic layer, the perimeter becomes difficult to collapse and workability improves. Simultaneously, the contamination caused by particle dropping out may be prevented.

Such porous-gas passing body can be fixed onto the leading edge section of the longitudinal hole of the shower plate by fitting or sintering combination. In the case when fitting both the porous-gas passing body and the shower plate in the state of a sintered body, the outer measurement of the porous-gas passing body is set at 0~–0.002 mm against the inside measurement of the longitudinal hole of the shower plate and the porous-gas passing body and the shower plate are sintered and fitted, cooled and fitted, or fitted with pressure.

Or the porous-gas passing body whose external surface is coated with heat resistant adhesives for ceramics is inserted into the longitudinal hole of the sintered shower plate. Then, the porous-gas passing body can also be attached in the state where it is firmly adhered by calcinating at temperature of not lower than 400° C.

The porous-gas passing body and the shower plate may be attached in a stage before sintering, and then, they can also be simultaneously sintered. That is, with regard to the porous-gas passing body, the porous-gas passing body is attached to the longitudinal hole of the shower plate at the stage of the powder molded body into which a powder ingredient of the porous-gas passing body has been molded and has been manufactured into a specified shape, its degreasing body, a temporary sintered body or a sintered body, then, it is simultaneously sintered. With regard to the shower plate, the porous-gas passing body is attached to the longitudinal hole of the shower plate at the stage of the green body into which a powder ingredient of the shower plate has been molded and the longitudinal hole has been formed therein, the degreasing body or a temporary sintered body, and then, it is simultaneously sintered. In this case, molding conditions, or the conditions of subsequent degreasing and temporary sintering are adjusted so that contraction percentage of each member at the time of simultaneous sintering may be almost the same, and binding force at least to the porous-gas passing body may act. As described above, by attaching the porous-gas passing body to the longitudinal hole at the stage of a green body and then sintering them simultaneously, it becomes possible to securely fix the porous-gas passing body onto the longitudinal hole of the shower plate.

In the present invention, it is also possible to use a structure in which a ceramic member having a plurality of gas discharge holes has been formed may be attached into the longitudinal hole opened in the shower plate. That is, the gas discharge hole is formed in the ceramic member, which is a different body from a shower plate, and the longitudinal hole opened in the shower plate is equipped with this ceramic member. By having such structure, a fine and long gas discharge hole can be easily formed in the shower plate compared with a case where the gas discharge hole is formed by hole processing. The ceramic member into which a gas discharge hole has been structured can be formed by injection molding, extrusion molding or special casting molding, etc. It is preferred to make the aperture not greater than two times of sheath thickness of plasma formed directly under the shower plate as the size of the gas discharge hole, and to make the length greater than a mean free path of an electron in a processing chamber. As described above, by providing a fine and long gas discharge hole, a back-flow of plasma can be prevented conjointly more securely with the effect of the porous-gas passing body provided in the gas introduction side.

As concrete embodiments having a member, to which the above gas discharge holes have been formed, it is preferred to block the gas discharge side of each longitudinal hole with the aforementioned members. In this case, while making the gas discharge side of the longitudinal hole narrower than the gas introduction side and providing the member in the narrow portion, it is preferred to make the member extend also in the gas introduction side. The porous-gas passing body can also be arranged in the gas introduction side of the longitudinal hole so that the porous-gas passing body may be communicated with the gas discharge hole of the member. As for the length of the gas discharge hole, in such structure, it is preferred to make it longer than the mean free path of an electron in the plasma processing apparatus. As for the aperture, it is preferred to make it not greater than twice of the sheath thickness of plasma formed directly under a shower plate. As for the aperture of the pore of the porous-gas passing body, it is preferred to be not greater than the sheath thickness of plasma formed directly under a shower plate.

In the longitudinal hole part of the shower plate used as a gas flowing path portion of gas for plasma excitation, electric field of microwave concentrates in the corner of the gas introduction side. Therefore, electric field concentration can be prevented by giving chamfering processing to the corner, and self-generating of plasma, namely, an ignition phenomenon of gas for plasma excitation, can be prevented.

And gas for plasma excitation is supplied into the plasma processing apparatus using the shower plate of the present invention described above. Supplied gas for plasma excitation is excited by the microwave and generates plasma. And oxidization, nitriding, oxy nitriding, CVD, etching, and a plasma exposure can be processed to a substrate using this plasma.

Effects of the Invention

According to the present invention, back-flow of plasma into the longitudinal hole used as a releasing path of gas for plasma excitation of a shower plate can be prevented. Occurrence of abnormal electric discharge or deposition of gas inside the shower plate can be suppressed. Therefore, degradation of transmission efficiency of microwave for exciting plasma or the lowering of yield can be prevented.

Since the degree of flatness of the surface that faces plasma cannot be impeded and gas for plasma excitation can moreover be discharged uniformly without variation, uniform and efficient plasma excitation is attained.

DETAILED DESCRIPTION OF THE PRESENT INVENTION

Hereafter, embodiments of the present invention will be described based on an embodiment.

First Embodiment

FIG. 1 illustrates a first embodiment of the present invention. A microwave plasma processing apparatus is illustrated in FIG. 1. An illustrated microwave plasma processing apparatus has a processing chamber 102 in which gas is exhausted via a plurality of exhaust ports 101. In the processing chamber 102, a holding member 104 for holding a substrate to be processed 103 is arranged. In order to uniformly exhaust gas of the processing chamber 102, the processing chamber 102 defines a ring shaped space to the circumference of the holding member 104. The plurality of exhaust ports 101 is arranged in regular intervals to communicate with space, namely, they are arranged in axial symmetry against the substrate to be processed 103. By an arrangement of these exhaust ports 101, gas in the processing chamber 102 can be exhausted more uniformly through the exhaust ports 101.

A shower plate 105 is fixed onto the upper section of the processing chamber 102 via O-ring for seals 106 at a position that corresponds to the position of substrate to be processed 103 on the holding member 104 as a part of an outer wall of the processing chamber 102. The shower plate 105 is configured by alumina of dielectric that has low microwave dielectric loss (dielectric loss is no greater than $1 \times 10^{-3}$, more preferably, no greater than $5 \times 10^{-4}$), has a diameter of 408 mm, and has a relative permittivity of 9.8. A wall surface 107 that configures the processing chamber 102 includes a ring shaped space 109 surrounded by two of O-ring for seal 108 and the side surface of shower plate 105 in the position corresponding to the side surface of shower plate 105. The ring shaped space 109 communicates with a gas introduction port 110 that introduces gas for plasma excitation.

On the other hand, a large number of side holes 111 having a diameter of 1 mm have been opened in the side surface of the shower plate 105 toward the direction of the center of the shower plate 105 in the lateral direction. At the same time, a large number of longitudinal holes 112 (230 pieces), which has been opened to communicate with the side hole 111, have been opened to communicate with the processing chamber 102.

FIG. 2 illustrates an arrangement of the side holes 111 and longitudinal holes 112 seen from the upper surface of shower plate 105. FIG. 3 is a perspective view showing the arrangement of the side holes 111 and the longitudinal holes 112. FIG. 4 shows details of the longitudinal hole 112. The longitudinal hole 112 is structured by a first longitudinal hole 112a with a diameter of 10 mm and a depth of 10 mm provided in the processing chamber 102 side, and further, a second longitudinal hole 112b with a diameter of 1 mm provided in the forefront (gas introduction side). The longitudinal hole 112 communicates with the side hole 111. Further, in the first longitudinal hole 112a, viewed from the processing chamber 102 side, a ceramic member 113, which is formed by an alumina extrusion cast, has a height of 5 mm and a plurality of gas discharge holes 113a having a diameters of 50 μm opening, and a sintered porous-ceramic body 114, which has the pore communicating in gas flow direction, has a diameter of 10 mm and has a height of 5 mm, are attached in the order.

Here, the second longitudinal hole 112b in the gas introduction side of the sintered porous-ceramic body 114 corresponds to a "gas passage hole" of Claim 5 of this application.

With reference to FIG. 1, an introducing method of gas for plasma excitation into the processing chamber will be shown. Gas for plasma excitation introduced from a gas introduction port 110 is introduced to the ring shaped space 109. Further, gas for plasma excitation is eventually introduced to the processing chamber 102 from the gas discharge hole 113a provided on the leading edge of the longitudinal hole 112 via the side hole 111 and the longitudinal hole 112.

For radiating microwave, a slot plate 115 of a radial line slot antenna with many slits opened, a delay wave plate 116 for transmitting microwave in the radial direction, and a coaxial waveguide 117 for introducing microwave to an antenna are provided on the shower plate 105. The delay wave plate 116 is sandwiched by the slot plate 115 and a metal plate 118. A channel 119 for cooling is provided in the metal plate 118.

Gas for plasma excitation supplied from the shower plate 105 is ionized by microwave emitted from slot plate 115 in such structure. Thereby, high-density plasma is generated in an area of a several millimeters directly under the shower plate 105. Generated plasma reaches to the substrate to be processed 103 by diffusion. From shower plate 105, oxygen gas and ammonia gas may be introduced as gas for positively generating radical other than gas for plasma excitation.

In the illustrated plasma processing apparatus, a lower-berth shower plate 120 made of conductor, such as aluminum or stainless steel is arranged between the shower plate 105 and the substrate to be processed 103 within the processing chamber 102. This lower-berth shower plate 120 is provided with a plurality of gas flowing paths 120a for introducing process gas supplied from a process gas supply port 121 to the substrate to be processed 103 in the processing chamber 102. Process gas is discharged to space between the lower-berth shower plate 120 and the substrate to be processed 103 by a large number of nozzles 120b formed on the surface corresponding to the substrate to be processed 103 of gas flowing path 120a. Here, as process gas, in the case of a Plasma-Enhanced Chemical Vapor Deposition (PECVD) process, silane gas, and disilane gas are introduced in the case of thin film formation of a silicon system, and, $C_5F_8$ gas will be introduced in the case of forming a low dielectric constant film. CVD to which organic metal gas is introduced as process gas is also possible. In the case of a Reactive Ion Etching (RIE) process, $C_5F_8$ gas and oxygen gas will be introduced in the case of silicon oxide film etching, and chlorine gas and HBr gas will be introduced in the case of a metal film or silicon etching. In the case where ion energy is required when etching, self-bias voltage is generated on the substrate to be processed 103 by connecting RF power supply 122 to an electrode installed inside of the holding member 104 via a capacitor and applying RF electric power. The type of gas of process gas to flow is not limited to the above-mentioned description. The gas to flow and pressure may be set up based on the process.

In the lower-berth shower plate 120, an opening section 120c of a size that enables plasma to be excited by microwave in the upper portion of the lower-berth shower plate 120 to efficiently pass the space between the substrate to be processed 103 and the lower-berth shower plate 120 by diffusion is formed in between the gas flowing paths 120a that adjoin each other.

Heat flow into the shower plate 105 by being exposed to high-density plasma is exhausted with coolant, such as water poured into the channel 119 for cooling via the slot plate 115, the delay wave plate 116 and the metal plate 118.

In referring to FIG. 4, the diameter of the plurality of gas discharge holes 113a, which has been opened in a cylindrical ceramic member 113 formed of alumina material in this example, is set to 50 μm. This figure is smaller than twice of 40 μm, which is a sheath thickness of high-density plasma of $10^{12}$ cm$^{-3}$. However, it is greater than twice of 10 μm, which is a sheath thickness of high-density plasma of $10^{13}$ cm$^{-3}$.

Here, the ceramic member 113 is structured by material formed from high purity $Al_2O_3$ of not less than 99.95% having dielectric loss of $1\times10^{-3}$.

Thickness "d" of the sheath formed in the substance surface, which is in contact with plasma, is given with a following formula.

$$d = 0.606\lambda_D\left(\frac{2V_0}{T_e}\right)^{3/4} \quad \text{Formula 1}$$

Here, $V_0$ is a voltage difference (a unit is V) of plasma and a substance, $T_e$ is electron temperature (a unit is eV), and $\lambda_D$ is Debye length given with a following formula.

$$\lambda_D = \sqrt{\frac{\varepsilon_0 k T_e}{n_e e^2}} \quad \text{Formula 2}$$

$$= 7.43\times 10^3 \sqrt{\frac{T_e[\text{eV}]}{n_e[m^{-3}]}} \ [m]$$

Here, $\varepsilon_0$ is a vacuous magnetic permeability, k is Boltzmann constant and $n_e$ is an electron density of plasma.

Since Debye length will decrease when electron density of plasma rises as shown in Table 1, from a viewpoint of preventing an back-flow of plasma, it is desirable that an aperture of gas discharge hole 113a is small.

TABLE 1

| | $T_e$ = 2 eV, $V_o$ = 12 V | |
|---|---|---|
| Plasma Density (cm$^{-3}$) | Debye Length (mm) | Sheath Thickness (mm) |
| $10^{13}$ | 0.003 | 0.01 |
| $10^{12}$ | 0.011 | 0.04 |
| $10^{11}$ | 0.033 | 0.13 |
| $10^{10}$ | 0.105 | 0.41 |

It becomes possible to reduce the back-flow of plasma dramatically by furthermore making the length of gas discharge hole 113a longer than a mean free path, which is an average distance until electrons are scattered about. An electron's mean free path is shown in Table 2. The mean free path is 4 mm in inverse proportion to pressure at the time of 0.1 Torr. In fact, as for the gas introduction side of gas discharge hole 113a, since pressure is high, a mean free path becomes shorter than 4 mm. However, in this example, the length of gas discharge hole 113a having a diameter of 50 μm shall be 5 mm, and it is considered as a value longer than a mean free path.

TABLE 2

Mean free path of an electron in Ar gas atmosphere

| Pressure (P) (Torr) | Mean free path (λ en) (mm) |
|---|---|
| 10 | 0.04 |
| 1 | 0.4 |
| 0.1 | 4 |

λ en (mm) = 0.4/P (Torr)

However, since the mean free path is the average distance to the end, from a statistical viewpoint, there is an electron, which travels longer distance without being scattered about. Therefore, in one embodiment of the present invention, the sintered porous-ceramic body 114 having the pore, which communicates in a gas flow direction is installed in the gas introduction side of gas discharge hole 113a.

With regard to the size of the pore diameter, in order to control plasma to flow backwards in the pore and abnormal electric discharge in the second longitudinal hole 112b, it is preferred that the size of the pore diameter is not greater than twice of sheath thickness of high-density plasma formed directly under the shower plate 105, desirably not greater than the sheath thickness. The size of pores of the sintered porous-ceramic body 114 in this embodiment, namely, a narrow path of a gas flowing path, is not greater than 10 μm, which is equal to or less than 10 μm that is the sheath thickness of high-density plasma of $10^{13}$ cm$^{-3}$. In this way, this shower plate can be used also against high-density plasma of $10^{13}$ cm$^{-3}$.

With the shower plate 105 having the above structure, the back-flow of plasma to the gas introduction side of longitudinal hole 112 can be prevented. Since occurrence of abnormal electric discharge inside the shower plate 105 or deposition of gas is suppressed, degradation of transmission efficiency of microwave for exciting plasma or the degradation of yield can be prevented. The degree of flatness of the surface facing plasma is not lowered and efficient plasma excitation is attained. In addition, since the gas discharge hole 113a is formed by the pressing and molding method onto the ceramic member 113 being a separate body of the shower plate 105, compared with a case where a gas discharge hole is formed by hole processing, a fine and long gas discharge hole having a diameter of not greater than 0.1 mm can now be formed easily in the shower plate.

Gas supply for plasma excitation is uniformly performed to substrate to be processed 103. Process gas is discharged toward the substrate to be processed 103 from the lower-berth shower plate 120 via the nozzle 120b, then the flow of process gas, which traveling to the substrate to be processed 103 from the nozzle 120b provided in the lower-berth shower plate 120, becomes uniform. Further, parts of the process gas, which return to an upper portion of the shower plate 105, have decreased. As a result, decomposition of the process gas molecules by superfluous dissociation by being exposed to high-density plasma decreased. Although process gas is sedimentary gas, degradation of microwave introduction efficiency by deposition of the gas on the shower plate 105 becomes hard to occur. Therefore, while improving productivity by shortening the cleaning time and improving process stability and reproducibility, high quality substrate treatment became possible.

The number, a diameter, and length of the gas discharge hole 113a, which can be opened in the ceramic member 113, and the number, a diameter and length of the first longitudinal hole 112a and the second longitudinal hole 112b, are not limited to the numerical value of this example.

Second Embodiment

A second embodiment of the present invention is shown in FIG. 5. Referring to FIG. 5, a microwave plasma processing apparatus is shown. The same symbols are attached to the portions, which overlap with the first embodiment, and the explanation will be omitted.

In this example, in the upper portion of the processing chamber 102, a plate-shaped shower plate 201 is attached via O-ring for seals 106 as a part of outer wall of processing chamber 102 in the position corresponding to the substrate to be processed 103 on the holding member 104. A large number of openings (230 pieces), namely, longitudinal holes 200, have been formed on the plate-shaped shower plate 201. The plate-shaped shower plate 201 is structured by the alumina having a relative permittivity of 9.8 and low microwave dielectric loss (dielectric loss is $1 \times 10^{-4}$ or lower). Further, in the processing chamber 102, a cover plate 202, which is formed of alumina, is attached onto the upper surface side of the shower plate 201, namely, on the opposite side of holding member 104 against shower plate 201 via another O-ring for seals 203.

FIG. 6 is a perspective view showing arrangement of the shower plate 201 and the cover plate 202. When referring to FIGS. 5 and 6, in between the upper surface of the shower plate 201 and the cover plate 202, formed is space 205, which will be filled up with gas for plasma excitation supplied from gas supply port 110 for plasma excitation via gas supply hole 204 that communicates and is opened into the shower plate 201. In other words, in the cover plate 202, grooves are provided so that each may be connected with a position corresponding to longitudinal hole 200 of the surface in the shower plate 201 side of cover plate 202 and gas supply hole 204, and space 205 is formed between shower plate 201 and cover plate 202. That is, longitudinal hole 200 is arranged to communicate with space 205.

Details of a longitudinal hole 200 are shown in FIG. 7. In FIG. 7, (a) is a sectional view and (b) is a bottom view. The longitudinal hole 200 is configured by a first longitudinal hole 200a having a diameter of 5 mm and a height of 2 mm from the processing chamber 102 side and a second longitudinal hole 200b having a diameter of 10 to 20 mm and a height of 8 to 20 mm. Six of a cylindrical ceramic member 206 in which a gas discharge hole 206a having a diameter of 50 μm and a length of 8 mm that is formed of alumina are fixed onto a part of the first longitudinal hole 200a and the second longitudinal hole 200b. Electric field of microwave concentrates on the corner of the gas introduction side of longitudinal hole 200, and electric discharge takes place on it. Chamfering process 208 is performed to prevent the self-generating of plasma by the ignition of gas for plasma. This chamfering processing can be C chamfering, more preferably, R chamfering processing, and can also perform R chamfering processing of that corner after C chamfering.

With the shower plate 201, which has the above structure, the back-flow of plasma into the gas introduction side of longitudinal hole 200 can be prevented. And the phenomenon in which gas for plasma excitation in the gas introduction side corner of longitudinal hole 200 ignites has also disappeared.

Desirable ideal structure of the ceramic member 206 is shown in FIG. 8. In FIG. 8, (a) is a sectional view, and (b) is a bottom view. As shown in the same drawing, the aperture of gas discharge holes 206a to be formed in the ceramic member 206 is preferably set about 2-5 μm and the interval of those is set about 10-20 μm.

As shown in FIG. 9, in order to securely prevent the back-flow of plasma, a sintered porous-ceramic body 207 having the pore that communicates in the gas flow direction may be provided in the gas introduction side of the ceramic member 206 of the same size as FIG. 7 so that the gas discharge hole 206a provided in the ceramic member 206 may be communicated. Here, a space portion of the second longitudinal hole 200b in the gas introduction side of the sintered porous-ceramic body 207 corresponds to a "gas passage hole" of Claim 5 of this application.

$Al_2O_3$ material having purity of not less than 99.95%, a diameter of an average crystal size of 1 μm, flexural strength of 100 MPa and, moreover, an average pore diameter of 3 μm, the pore rate of 45% and thickness of 4 mm is used as the sintered porous-ceramic body 207 shown in FIG. 9 of this embodiment.

Also in this example, the same effect as the first embodiment is acquired.

The diameter, the length and the number of the first longitudinal hole 200a and the second longitudinal hole 200b, and the diameter, the length, and the number of the gas discharge hole 206a that can be opened in the ceramic member 206 are not limited to a numerical value of this example.

Third Embodiment

A third embodiment of the present invention is shown in FIG. 10. A microwave plasma processing apparatus is shown in FIG. 10. The same symbols are attached to the portions, which overlap with the first and the second embodiments, and the explanation will be omitted. A longitudinal hole 300 of a shower plate 301 in this example is having structure as shown in FIG. 11. That is, a gas discharge hole 300a, 0.05 mm in diameter and 0.5 mm in length, has been opened in the processing chamber 102 side where plasma is excited. The gas introduction side of the gas discharge hole 300a is connected to a hole 300b having diameter of 1 mm. In order to avoid electric field concentration of microwave, a chamfering processing 303 is given to the corner of gas introduction side of the hole 300b. And a sintered porous-ceramic body 302 having a cylindrical shape of height of 5 mm and having a pore that communicates in the gas flow direction is fixed onto the bottom section of the hole 300b having the diameter of 1 mm. Since the gas discharge hole 300a is directly opened in a shower plate formed of alumina in this example, it is difficult to be not shorter than 1 mm in length. Since the gas discharge hole 300a is shorter than an electron's mean free path, an electron flows backwards. As a result, plasma ignites in a space 205 and the longitudinal hole 300, while the ignition phenomenon may be performed continuously. In order to prevent this, the sintered porous-ceramic body 302 of the same material property as having used for the second embodiment is provided in the gas introduction side of the gas discharge hole 300a.

Also in this example, the same effect as the first embodiment is acquired.

The number, the diameter and the length of longitudinal hole 300, gas discharge hole 300a and hole 300b are not limited to the numerical value of this example.

Fourth Embodiment

A fourth embodiment of a present invention is shown in FIG. 12. FIG. 12 shows a microwave plasma processing apparatus. The same symbols are attached to the portions, and the explanations are omitted.

A large number of side holes 401 having a diameter of 1 mm are opened in the side surface of a shower plate 400 toward the direction of the center of the shower plate 400 at a lateral direction. At the same time, a large number of longitudinal holes 402 (230 pieces), which are opened so that they may communicate with the side hole 401, have been opened to communicate with the processing chamber 102.

FIG. 13 shows arrangement of the side hole 401 and the longitudinal hole 402 viewed from the upper surface of the shower plate 400. FIG. 14 is a perspective view showing the arrangement of the side hole 401 and the longitudinal hole 402. FIG. 15 shows details of the longitudinal hole 402. The length of the longitudinal hole 402 is about 8-21 mm, and a diameter is not greater than 3 mm (preferably not greater than 1 mm). The tip part is equipped with a sintered porous-ceramic body 403, that has a pore, which is cylindrical with height of about 2-6 mm and communicates in a gas flow direction. A sintered porous-ceramic body is configured by alumina system material. Used is a material whose pore diameter of the narrow path in the gas flowing path formed in the pore communicates: not greater than 10 μm; dielectric loss: not greater than $1 \times 10^{-3}$; a diameter of the average crystal: not greater than 10 μm; a pore rate: 20 to 75%; an average pore diameter: not greater than 10 μm; the maximum pore diameter: not greater than 75 μm; bending strength: not smaller than 30 MPa.

An example of manufacturing of the shower plate 400 onto which this sintered porous-ceramic body 403 is fixed will be described below.

(Example 1 of Manufacturing)

Performed was press molding of an atomizing granular powder body having average sizes of 70 μm obtained by blending wax of 3 mass % with $Al_2O_3$ powder whose purity is 99.99% and average powder size of 0.6 μm. Then, the green body with which forming process of an outer diameter, thickness, a side hole and the longitudinal hole were performed at a predetermined size and sintered, and a sintering material for shower plates whose relative density is 98% was obtained.

On the other hand, with regard to the sintered porous-ceramic body, after calcinating the atomizing granular powder body at 800° C. in the state of a granular material and obtaining a temporary sintered granular material, 3 mass % of the $Al_2O_3$ powder for the shower plates was added and mixed. Then, the green body acquired by performing press molding was sintered. Thereby, obtained is a sintered porous-ceramic body material having a pore diameter of a narrow path in the gas flowing path of a pore that communicates: 2 μm; dielectric loss: $2.5 \times 10^{-4}$; a diameter of an average crystal: 1.5 μm; a diameter of the maximum crystal: 3 μm; a pore rate: 40%; an average pore diameter: 3 μm; the maximum pore diameter: 5 μm; and bending strength: 300 MPa.

Finishing process of the inside diameter of the longitudinal hole of the sintered material for shower plates was performed so that it might be set to 3.0±0.001 mm. Thickness of the sintered porous-ceramic body material was manufactured so that it might be set to 6 mm, and finishing process of the outer diameter size was performed to 3.0 to 3.0-0.003 mm. Then, an ultrasonic cleaning process was performed, and as shown in FIG. 15, the sintered porous-ceramic body 403 was fitted into the longitudinal hole 402 by press fit. In cases where fitting space is too small, press fit is difficult. Press fit will become easy when a shower plate is heated at about 50-100° C.

(Example 2 of Manufacturing)

After performing press molding of the same atomizing granular powder body as having obtained in the example 1 of manufacturing by various pressure of 78-147 MPa, the green body for shower plates, in which the outer diameter, thickness, the side hole and the longitudinal hole have been formed into a predetermined size, was prepared.

On the other hand, as a sintered porous-ceramic body material, the same green body as the example 1 of manufacturing was obtained. The powder molding body that has been manufactured into a specified shape, the degreasing body that has been structured by calcinating at 450° C. and a temporary sintered body that has been calcinated at 600° C. were prepared.

The green body for shower plates differs in sintering contraction percentage corresponding to press-molding-pressure force. Incidentally in 78 Mpa, sintering contraction percentage is 19%, and in 147 MPa, it is 16.2%. With regard to the sintered porous-ceramic body material, whenever the setting change of the pore rate or of the pore diameter is performed, sintering contraction percentage changes, and the sintering contraction percentage changes also with press-molding-pressure force. Therefore, the sintering contraction percentage is investigated for every characteristic setup of the sintered porous-ceramic body in advance.

After the powder molding body, the degreasing body, or a temporary sintered body of the sintered porous-ceramic body, which has sintering contraction percentage equivalent to sintering contraction percentage of the green body for described shower plates or slightly small, is fixed onto the longitudinal hole, they were sintered simultaneously. Thereby, since sintering associative strength arises mutually, firm wearing fixation is secured.

(Example 3 of Manufacturing)

The same green body for shower plates as the example 1 of manufacturing and example 2 of manufacturing was calcinated at 450° C., and the degreasing body was obtained. Sintering contraction percentage of this degreasing body is the same as that of the green body.

The green body for shower plates was calcinated at 600-1000° C. (temporary sintering), and the temporary sintered body was obtained. Since some sintering contraction occurs in a temporary sintering stage in the case of a temporary sintered body, sintering contraction percentage at the time of performing actual sintering of the temporary sintered body becomes smaller as temporary sintering temperature becomes high.

On the other hand, since the sintered porous-ceramic body material obtained by the same manufacturing process as the example 1 and example 2 uses a granular material produced by temporarily sintering atomizing granular powder body, its sintering contraction percentage is a little smaller than the green body for shower plates and the sintering contraction percentage of the sintered porous-ceramic body material described above is close to that of a temporary sintered body of the green body for shower plates. Therefore, it is convenient to select a sintered porous-ceramic body material and shower plate material, which have the equivalent sintering contraction percentage.

A shower plate material and a sintered porous-ceramic body material, which has been attached into longitudinal hole, are simultaneously sintered in this example of manufacturing as well as in the example 2 of manufacturing. Thereby, since sintering associative strength arises mutually, firm wearing fixation is secured.

Further, the size after sintering of the longitudinal hole is to have been calculated from sintering contraction percentage of the green body for shower plates prepared in example 2 of manufacturing. Then, a porous-ceramic material whose sizes of after sintering of the green body of porous-ceramics material, the degreasing body and a temporary sintered body, and the size of a sintered body, are a little greater (about 1-50 μm) than the calculated size of after sintering of the longitudinal hole, is set into the longitudinal hole of the green body, and sintered simultaneously. Firm fixation, which has continuous crystal organization, is attained by sintering associative strength arising mutually by sintering simultaneously.

By the same method, which has been explained in the above-mentioned manufacturing examples 1-3, the ceramic member (113, 206, 404) to be attached onto the longitudinal hole of the shower plate can be sintered simultaneously with the shower plate to be attached to a predetermined position.

A rise of electron density of plasma will decrease Debey length as described above. Therefore, from the viewpoint of preventing the back-flow of plasma, it is desirable for the aperture of the sintered porous-ceramic body 403 to be smaller. Concretely, the size of the average pore diameter is preferred to be not greater than twice of the sheath thickness, and more desirably smaller than the sheath thickness of plasma. Pores of sintered porous-ceramic body 403, namely, a narrow path of a gas flowing path, are 10 μm and are not greater than the same degree as 10 μm that is the sheath thickness of high-density plasma of $10^{13}$ cm$^{-3}$. In this way, this shower plate can also be used for high-density plasma of $10^{13}$ cm$^{-3}$.

By using shower plate 400, which has the above structure, the back-flow of plasma into the gas introduction side of the longitudinal hole 402 can be prevented. Since occurrence of abnormal electric discharge inside the shower plate 400 or deposition of gas is suppressed, degradation of transmission efficiency of microwave for exciting plasma or the degradation of yield could be prevented.

Here, when using the porous-gas passing body within a small range of pore diameter and aeration rate, the thickness of the porous-gas passing body is 2-3 mm so that the gas for plasma excitation is supplied evenly in flow speed and flow rate over the entire surface without local unevenness and secure the flow rate of the gas discharged from the porous-gas passing body in a single longitudinal hole. In cases where such thin porous-gas passing body is used or in cases where the porous-gas passing body having a big average pore diameter and a big pore diameter of a narrow path is used, in order to prevent the back-flow of plasma more securely, as shown in FIG. 16 (a), the ceramic member 404, in which a plurality of gas flow holes 404a has been opened, may be provided so that the gas introduction side of sintered porous-ceramic body 403 may be communicated. The ceramic member 404 is an extrusion cast of not less than 99.95% of high purity alumina (dielectric loss is not greater than $1 \times 10^{-3}$), and the aperture of gas flow hole 404a is set to 50 μm in diameter. Although this figure is smaller than twice of the 40 μm, which is the sheath thickness of high-density plasma of $10^{12}$ cm$^{-3}$, it is greater than twice of the μm, which is the sheath thickness of high-density plasma of $10^{13}$ cm$^{-3}$. The length of gas flow hole 404a is 5 mm.

With regard to the length of this gas flow hole 404a, it is preferred to make it longer than a mean free path, which is the average distance until electrons are scattered about. The mean free path is in inverse proportion to pressure and it becomes 4 mm at the time of 0.1 Torr as above-mentioned. In fact, since pressure is high in the gas introduction side of gas flow hole 404a, the mean free path becomes shorter than 4 mm, but in this example, the length of gas discharge hole 404a is set to 5 mm, which is longer than the mean free path.

As shown in FIG. 16 (b), another sintered porous-ceramic body 403a is provided in the gas introduction side of sintered porous-ceramic body 403 instead of the ceramic member 404. Thereby, the back-flow of plasma can also be prevented more securely. In this case, in order to make the pressure loss of gas for plasma excitation small, with regard to the sintered porous-ceramic body 403a in the gas introduction side, the sintered porous-ceramic body 403a having a larger pore rate and pore diameter than the sintered porous-ceramic body 403 in the gas discharge side is used (for example, an average pore diameter: 10-30 μm, pore rate: 50-75%).

FIG. 17 shows other examples of the attachment of the sintered porous-ceramic body 403.

FIG. 17 (a) shows an example, in which the second longitudinal hole 402b having a large diameter is provided at the leading edge of the first longitudinal hole 402a, and the sintered porous-ceramic body 403 is attached to the leading edge of the first longitudinal hole 402a considering the second longitudinal hole 402b as an attaching portion of the sintered porous-ceramic body 403. In an example of FIG. 17 (a), the ceramic member 404 to which a plurality of gas flow holes 404a, which are the same as the gas flow holes explained in FIG. 16 (a) is opened is provided to the gas introduction side of sintered porous-ceramic body 403. By this, the back-flow of plasma can also be prevented more securely. Instead of the ceramic member 404, another sintered porous-ceramic body may be provided in the gas introduction side of the sintered porous-ceramic body 403 as same as an example of FIG. 16 (b).

In an example of FIG. 17 (b), the shape of the sintered porous-ceramic body 403, with which the second longitudinal hole 402b is equipped, is made into the shape where both the upper surface and the undersurface are curved in the shape of a concave curve toward the processing chamber 102. In an example of FIG. 17 (c), the shape of sintered porous-ceramic body 403, with which second longitudinal hole 402b having a large diameter provided at the edge of first longitudinal hole 402a is equipped, is made into the shape where both the upper surface and the undersurface are curved in the shape of a convex curve toward the processing chamber 102. Here, the sintered porous-ceramic body 403 is attached so that the lower end may not project from the undersurface of the shower plate 400. The sintered porous-ceramic body 403 having the shape, which is curved as shown in FIGS. 17(b) and 17(c), is used. Thereby, stress by thermal expansion and contraction at the time of use of the shower plate 400 is absorbable with deformation (bending). Cracks of the porous-gas passing body 403 and the shower plate 400 equipped with the porous-gas passing body 403 can be prevented. Since gas for plasma excitation can be more widely discharged in cases where the sintered porous-ceramic body 403 is structured in a convex curve toward the processing chamber 2 as shown in FIG. 17 (C), it becomes possible to generate more uniform plasma. Also in examples of FIGS. 17 (b) and 17(c), a ceramic member or another sintered porous-ceramic body in which a plurality of gas flow holes has been opened in the gas introduction side of sintered porous-ceramic body 403 may be provided.

In the above embodiments, the number, the diameter, and the length of longitudinal hole 112a are not limited to the numerical value of this example.

Fifth Embodiment

A fifth embodiment of the present invention is shown in FIG. 18. A microwave plasma processing apparatus is illustrated in FIG. 18. The same symbols are attached to the portions, which overlap with the first through the fourth embodiment, and explanation is omitted.

In this example, a plate-shaped shower plate 501 is attached in the position corresponding to the substrate to be processed 103 on the holding member 104 in the upper portion of the processing chamber 102 as a part of outer wall of the processing chamber 102 via the O-ring for seals 106. The plate shaped shower plate 501 is structured by alumina having a relative permittivity of 9.8 and low microwave dielectric loss (dielectric loss is not greater than $1\times10^{-4}$). A plurality of openings (230 pieces), namely, a longitudinal hole 500, is formed in the plate-shaped shower plate 501. In the processing chamber 102, the cover plate 202, which is formed by alumina, is attached on the upper surface side of the shower plate 501 via another O-ring for seals 203 on the opposite side of the holding member 104 against the shower plate 501.

FIG. 19 is a perspective view showing arrangement of the shower plate 501 and the cover plate 202. When referring to FIGS. 18 and 19, in between the upper surface of the shower plate 501 and the cover plate 202, the space 205 filled up with gas for plasma excitation supplied from gas supply port 110 for plasma excitation via gas supply hole 204 communicating, which is opened into the shower plate 501, is formed. In other words, in the cover plate 202, a groove is provided so that both the longitudinal hole 500 and the gas supply hole 204 may be connected in the position corresponding to the longitudinal hole 500 and the gas supply hole 204, which are on the surface of the shower plate 501 side of the cover plate 202. The space 205 is formed between the shower plate 501 and the cover plate 202. That is, the longitudinal hole 500 is arranged so that it may communicate with the space 205.

FIG. 20 shows details of the longitudinal hole 500. The longitudinal hole 500 is configured by a first longitudinal hole 500a having diameter of 8 mm and height of 3 mm, and a second longitudinal hole 500b having diameter of 10 mm and height of 7 mm. A sintered porous-ceramic body 502, which has the pore communicating in the gas flow direction, is fixed by fitting onto the entire first longitudinal hole 500a and second longitudinal hole 500b. The perimeter of the sintered porous-ceramic body 502 excluding the upper surface and undersurface is formed by fine ceramic layer 502a, and an inside is porosity section 502b. Structure of the porosity section 502b is the same as the sintered porous-ceramic body 403 of the fourth embodiment. The fine ceramic layer 502a had a characteristic value equivalent to the shower plate 501, concretely, dielectric loss: not greater than $1\times10^{-3}$; $Al_2O_3$: not less than 99.95%; and relative density: not less than 98% of material.

The sintered porous-ceramic body 502 having the fine ceramic layer 502a on its perimeter can be manufactured, for example, by the following methods.

That is, a cylindrical rubber mold is filled up with powder adjusted to porous-gas passing bodies and cold isostatic pressing (CIP) molding is performed. Then, the cylindrical forming body whose perimeter has been processed is set to the center of the cylindrical rubber mold, which is one size greater than the size of the cylindrical forming body. The outside of the cylindrical forming body is filled up with adjustment powder for fine ceramics. The forming body acquired by performing CIP molding is sintered with prescribed temperature again. Thereby, the porous-gas passing body of double structure can be obtained. It is important to set up each CIP molding conditions so that sintering contraction of the porous material section of the central part and the fine material section of the perimeter may become the same.

Also in this example, the same effect as the fourth embodiment is obtained.

In addition, the number, the diameter, and the length of the first longitudinal hole 500a and of the second longitudinal hole 500b are not limited to the numerical value of this example.

INDUSTRIAL APPLICABILITY

The shower plate of the present invention can be used for various kinds of plasma processing apparatuses, such as a parallel monotonous type high frequency excitation plasma processing apparatus and inductively-coupled plasma processing apparatus besides a microwave plasma processing apparatus.

BRIEF DESCRIPTION OF DRAWINGS

FIG. 7 illustrates a detail of the longitudinal hole of the shower plate illustrated in FIG. 5.

EXPLANATIONS OF LETTERS OR NUMERALS

Figure 1:
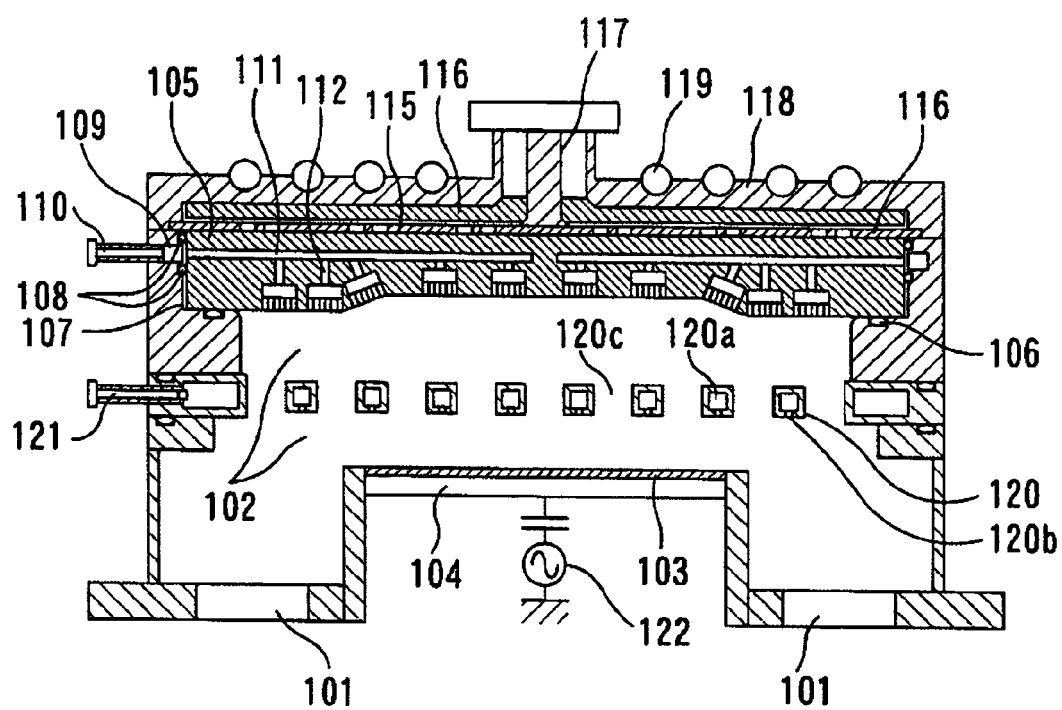
FIG. 1 illustrates the first embodiment of the present invention.
Figure 2:
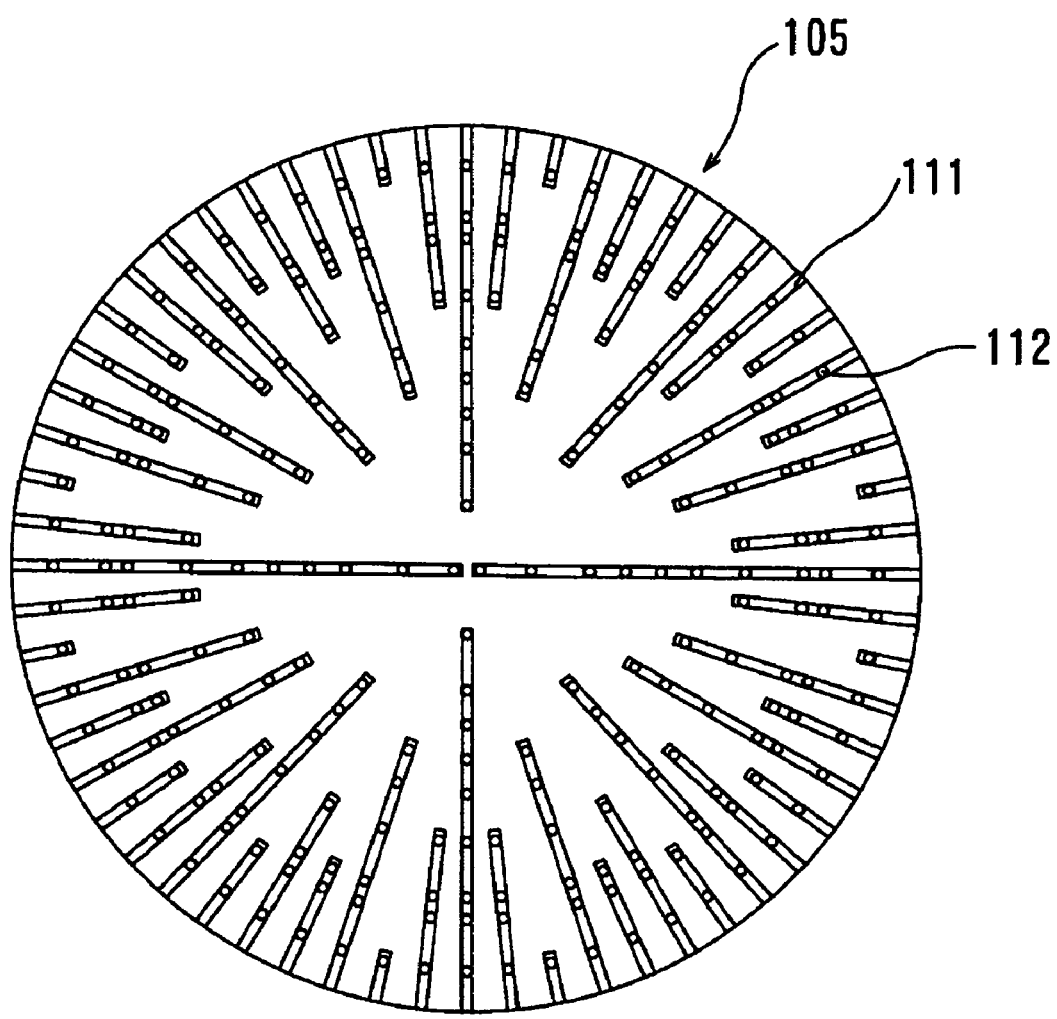
FIG. 2 illustrates an arrangement of a side hole and a longitudinal hole viewed from the upper surface of the shower plate illustrated in FIG. 1.
Figure 3:
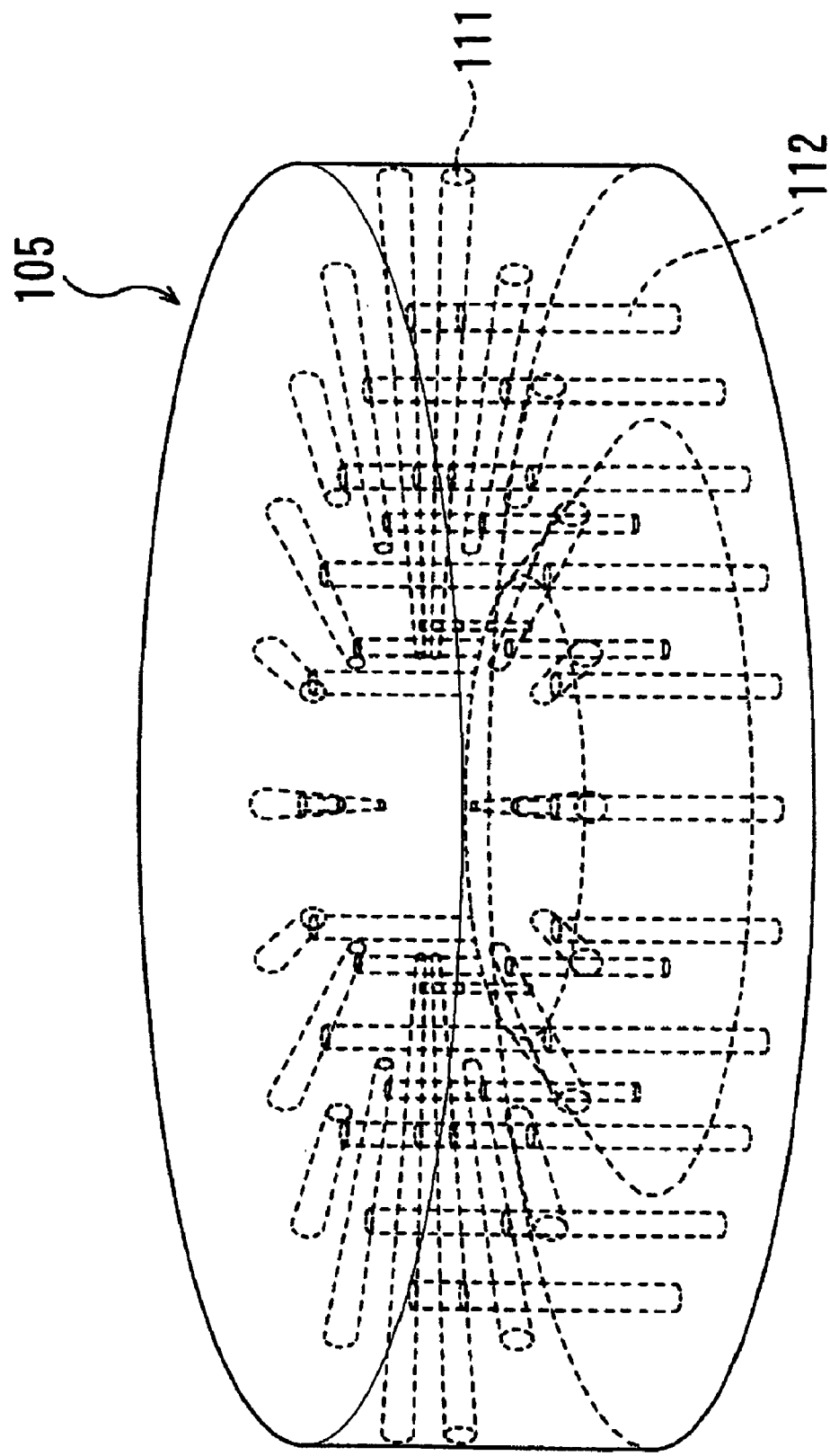
FIG. 3 illustrates the arrangement of the side hole and the longitudinal hole of the shower plate illustrated in FIG. 1.
Figure 4:
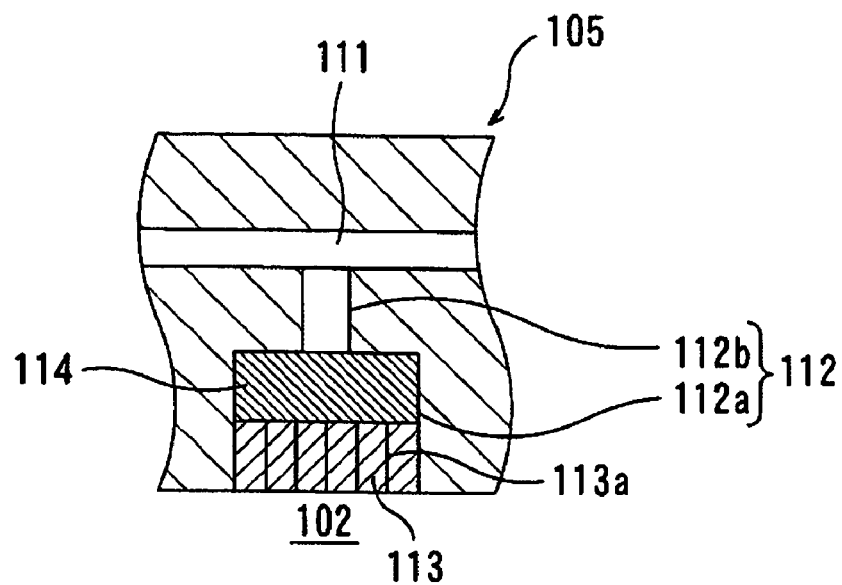
FIG. 4 illustrates a detail of the longitudinal hole of the shower plate illustrated in FIG. 1.
Figure 5:
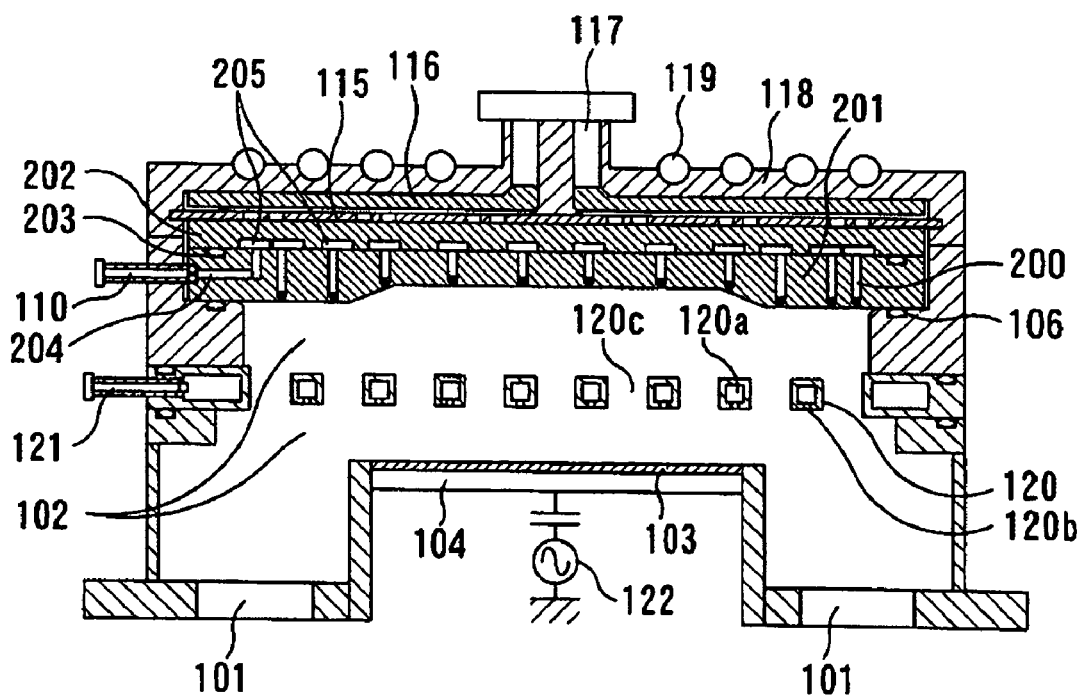
FIG. 5 illustrates the second embodiment of the present invention.
Figure 6:
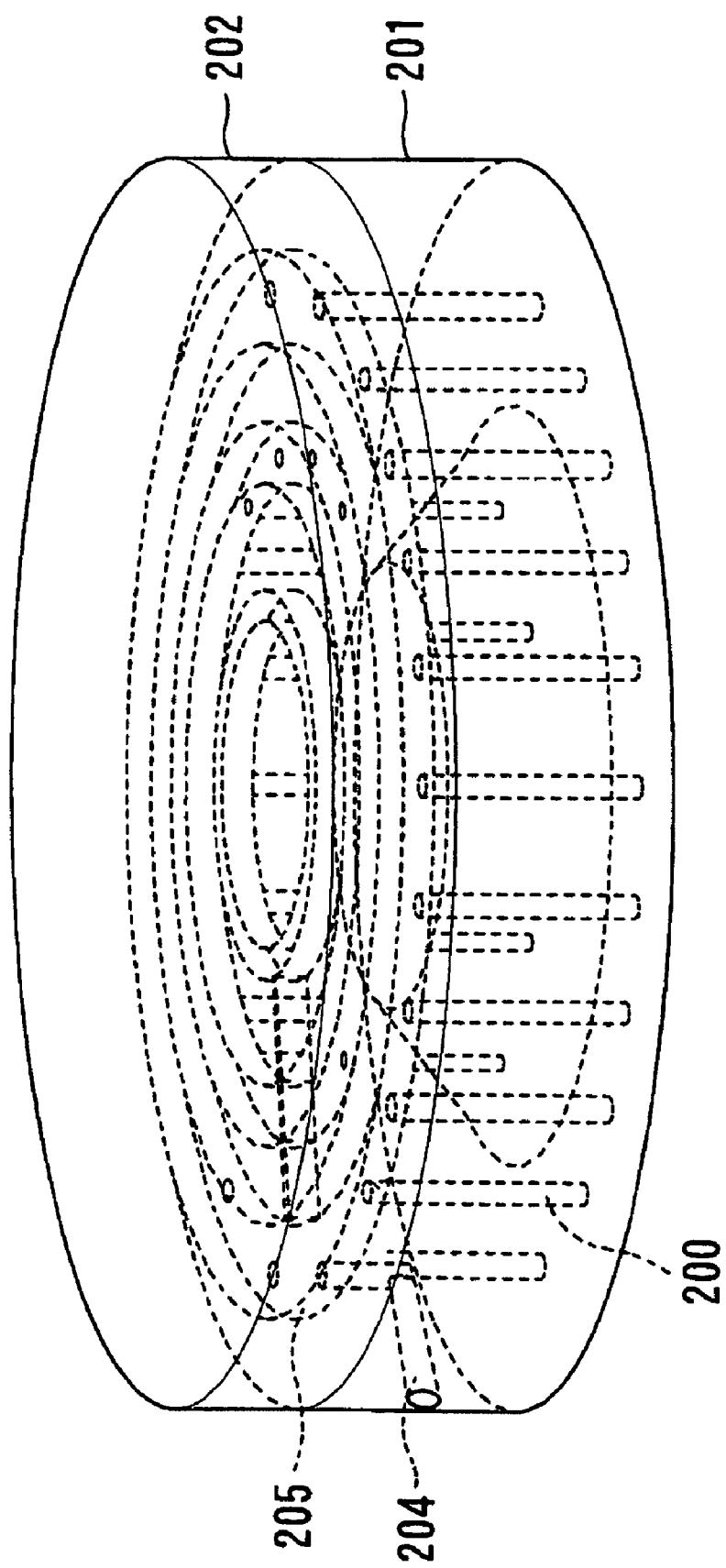
FIG. 6 illustrates an arrangement of a cover plate and the shower plate illustrated in FIG. 5.
Figure 8:
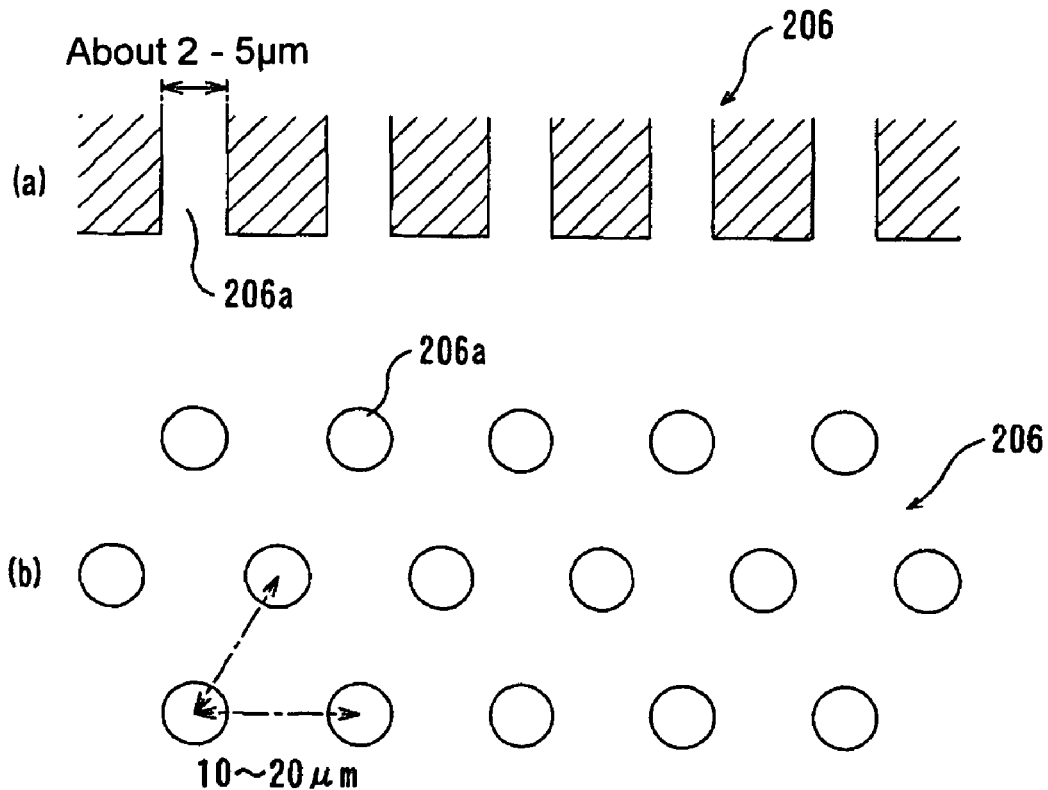
FIG. 8 illustrates an ideal structure of a ceramic member being fixed to the longitudinal hole of the shower plate illustrated in FIG. 5.
Figure 9:
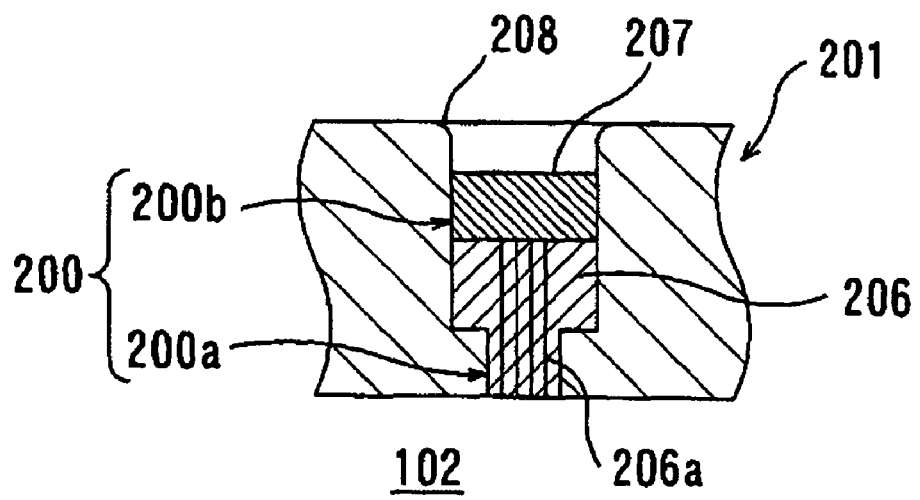
FIG. 9 illustrates an example of providing a sintered porous-ceramic body in the longitudinal hole of the shower plate illustrated in FIG. 7.
Figure 10:
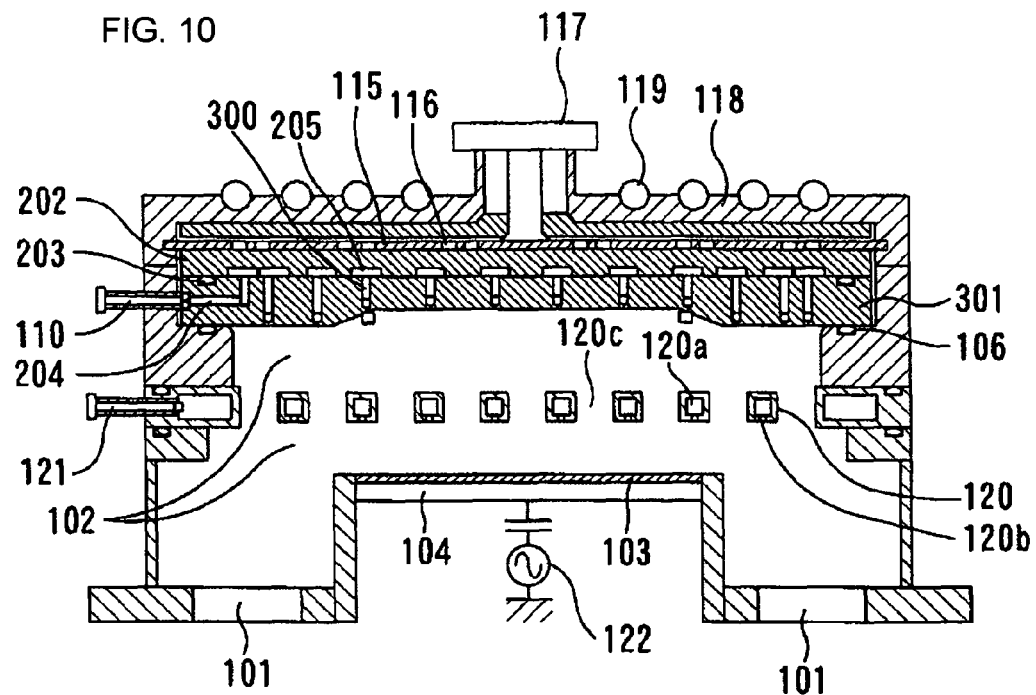
FIG. 10 illustrates the third embodiment of the present invention.
Figure 11:
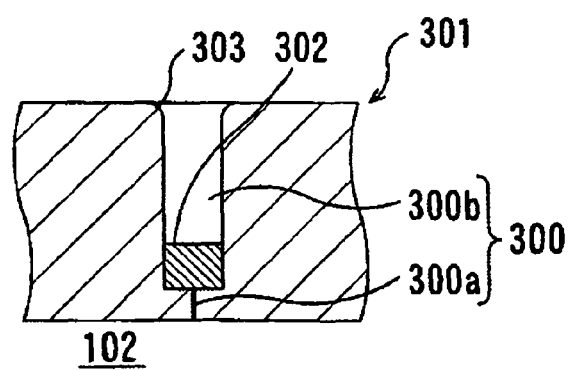
FIG. 11 illustrates a detail of the longitudinal hole of the shower plate illustrated in FIG. 10.
Figure 12:
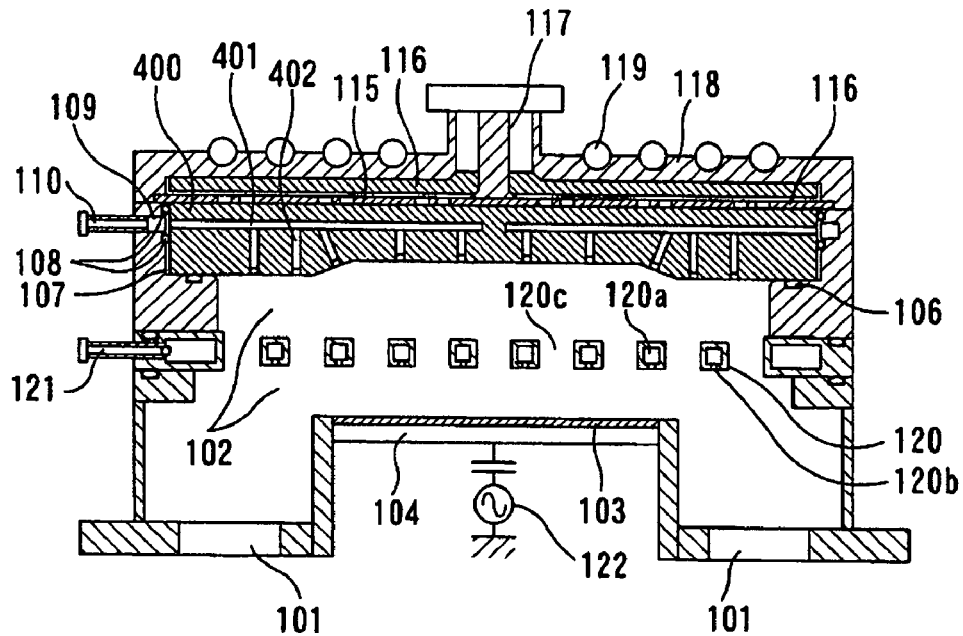
FIG. 12 illustrates the fourth embodiment of the present invention.
Figure 13:
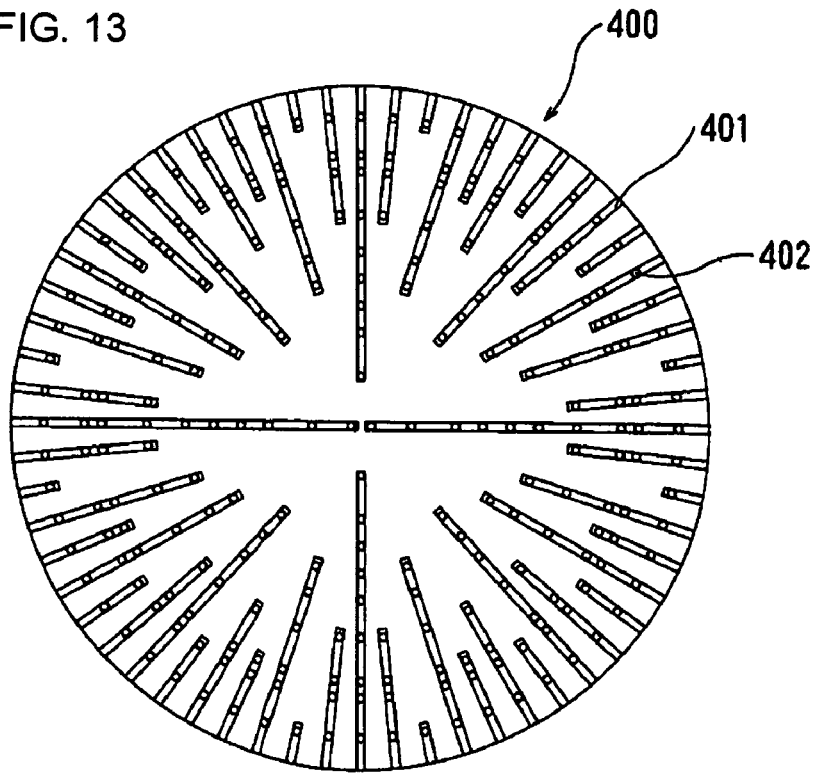
FIG. 13 illustrates an arrangement of a side hole and a longitudinal hole viewed from the upper surface of the shower plate illustrated in FIG. 12.
Figure 14:
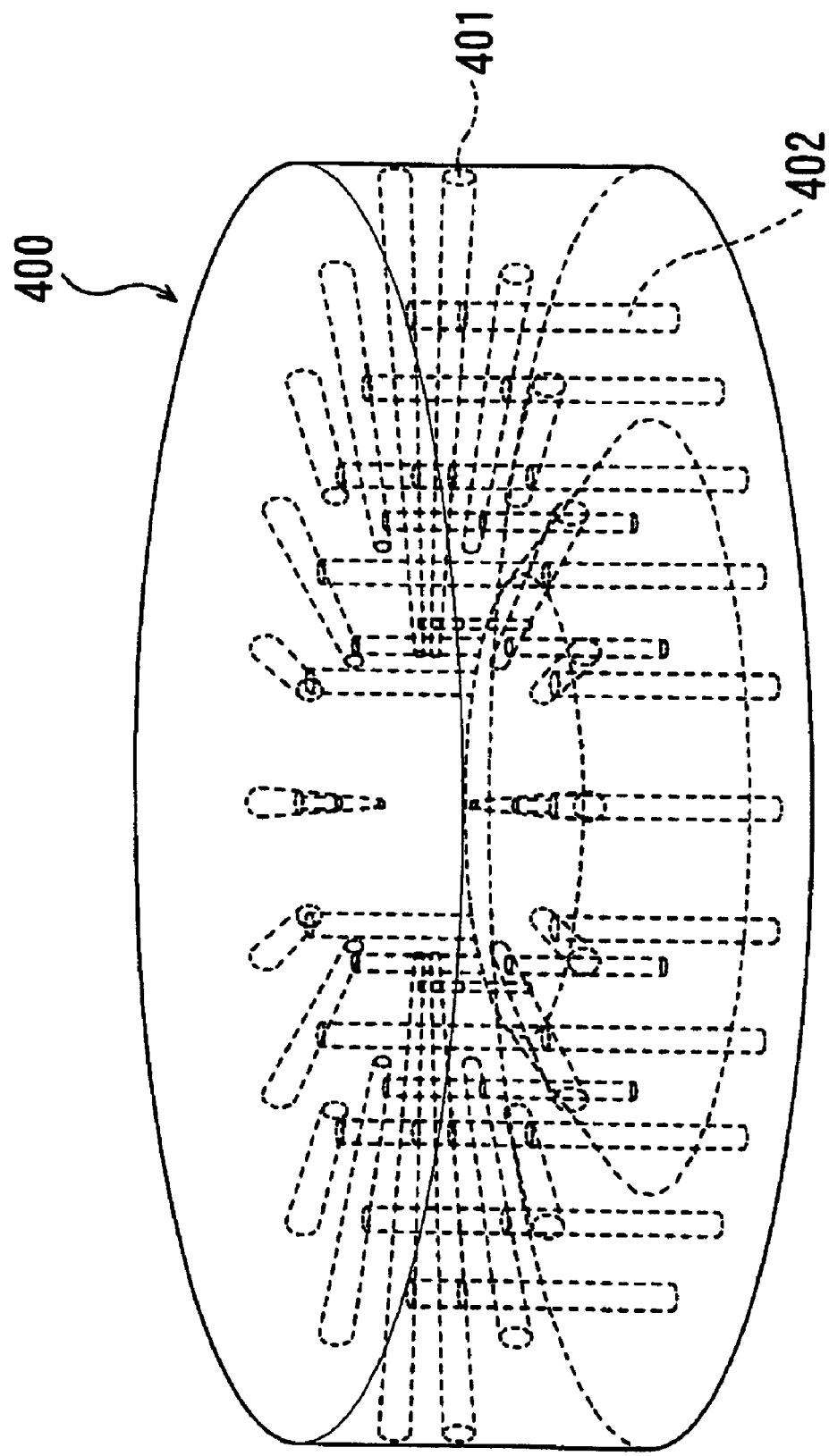
FIG. 14 illustrates an arrangement of the side hole and the longitudinal hole of the shower plate illustrated in FIG. 12.
Figure 15:
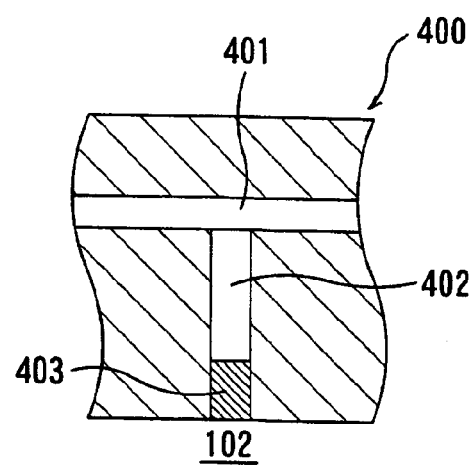
FIG. 15 illustrates a detail of the longitudinal hole of the shower plate illustrated in FIG. 12.
Figure 16:
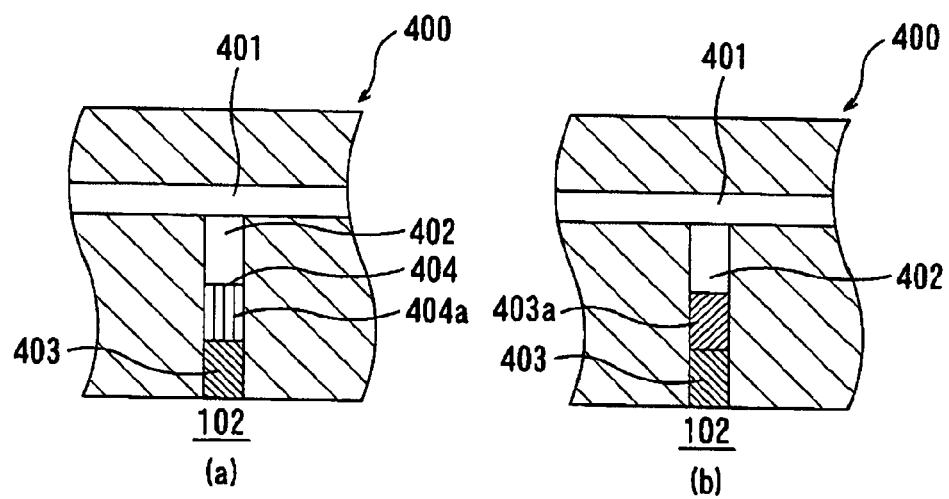
FIG. 16 illustrates an example of providing a ceramic member, which has a gas passing hole, or other sintered porous-ceramic body in a gas introduction side of a sintered porous-ceramic body that is fixed onto the leading edge of the longitudinal hole of the shower plate.
Figure 17:
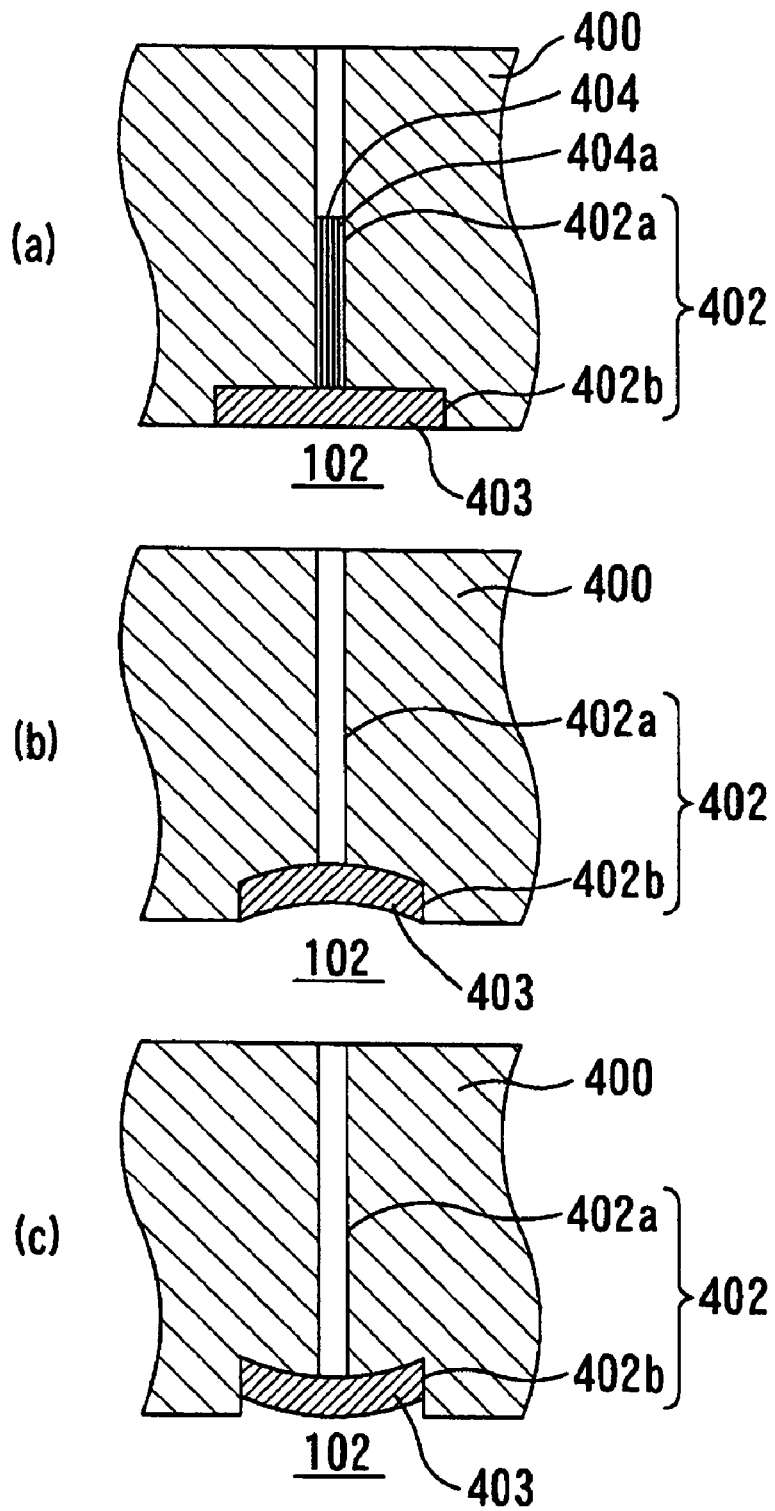
FIG. 17 illustrates another example of fixing the sintered porous-ceramic body.
Figure 18:
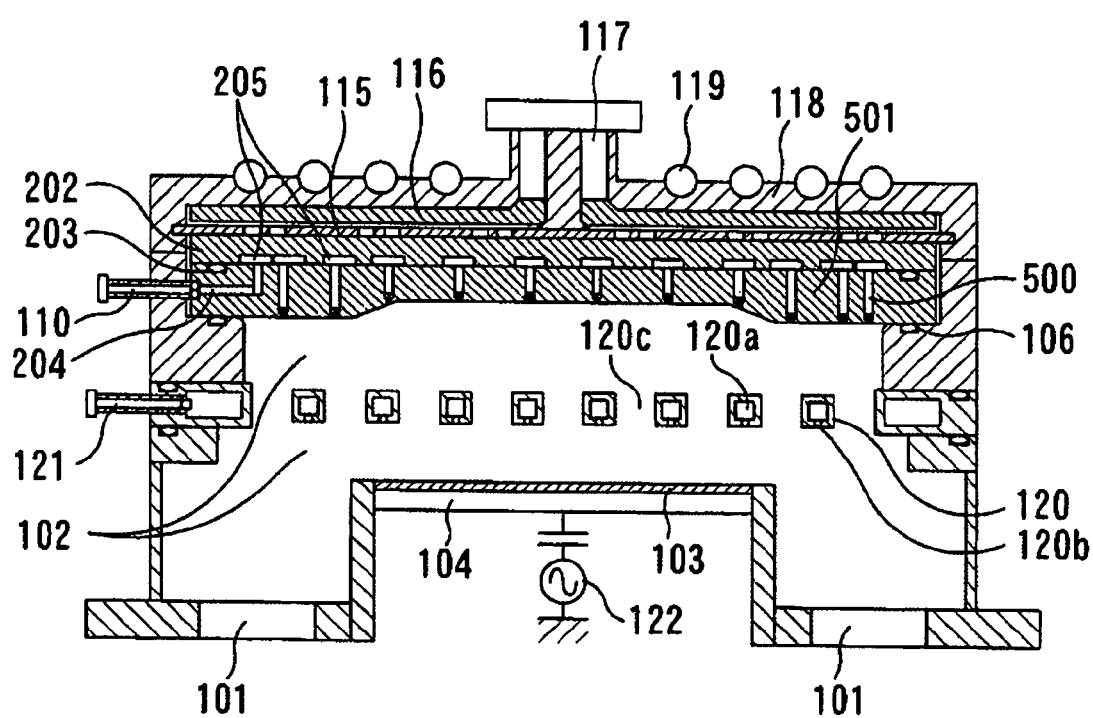
FIG. 18 illustrates the fifth embodiment of the present invention.
Figure 19:
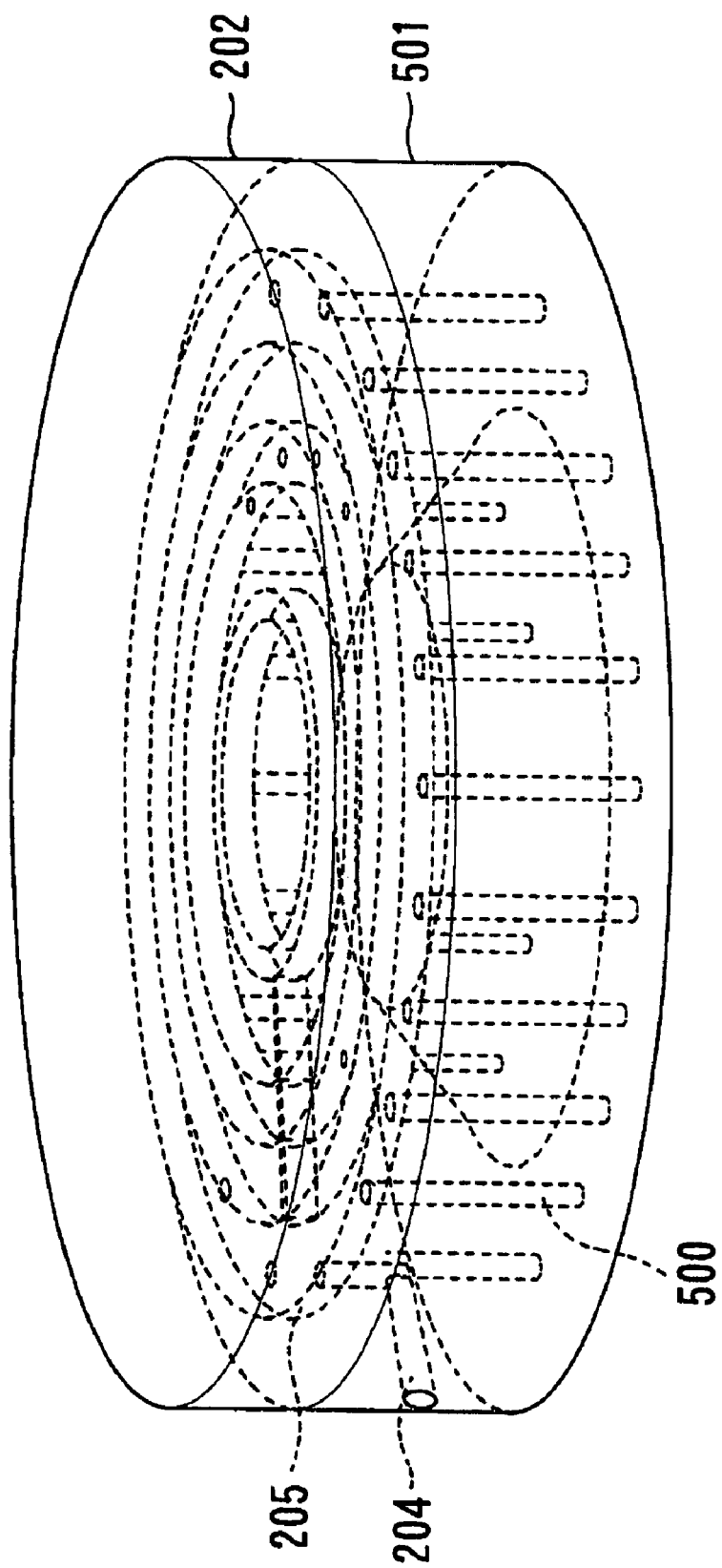
FIG. 19 illustrates an arrangement of the shower plate and cover plate, which are illustrated in FIG. 18.
Figure 20:
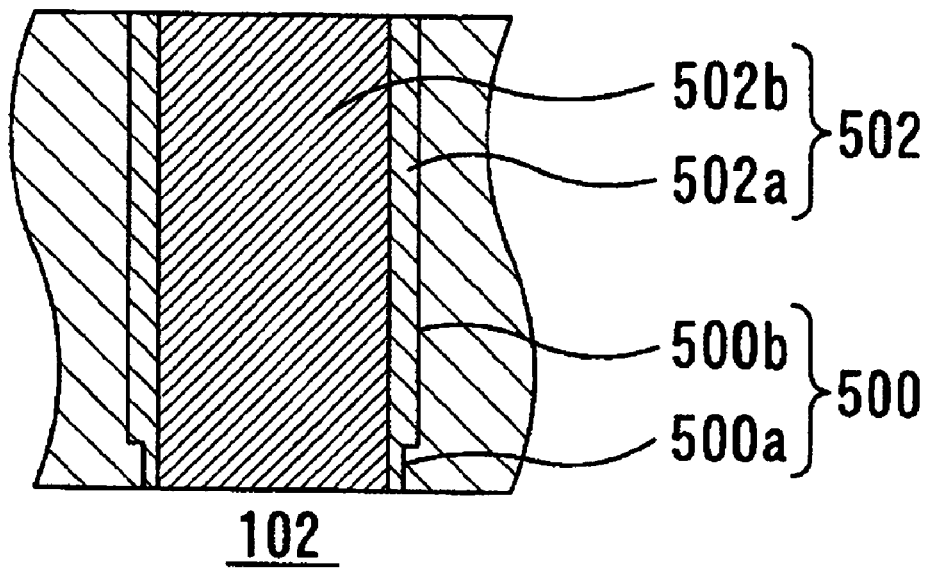
FIG. 20 illustrates a detail of the longitudinal hole of the shower plate illustrated in FIG. 18.
Figure 21:
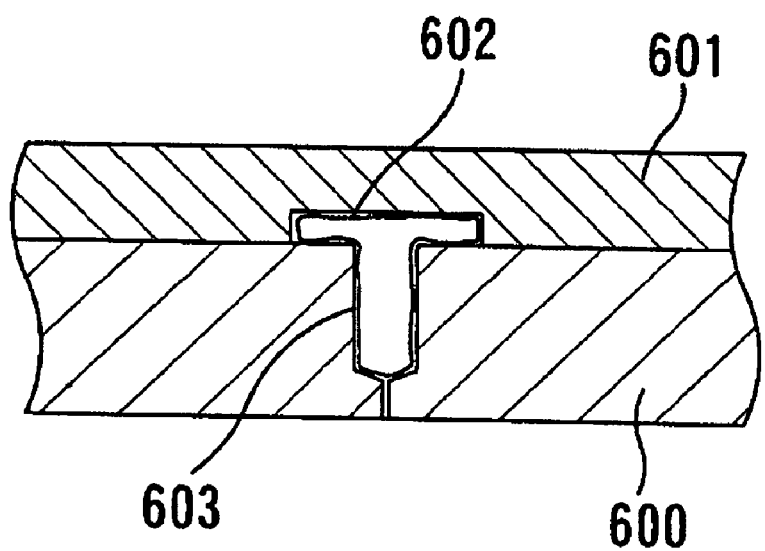
FIG. 21 illustrates a conventional shower plate.

101 EXHAUST PORT
102 PROCESSING CHAMBER
103 SUBSTRATE TO BE PROCESSED
104 HOLDING MEMBER
105 SHOWER PLATE
106 O-RING FOR SEALS
107 WALL SURFACE
108 O-RING FOR SEALS
109 RING SHAPED SPACE
110 GAS INTRODUCTION PORT
111 SIDE HOLES
112 LONGITUDINAL HOLE
112a FIRST LONGITUDINAL HOLE
112b SECOND LONGITUDINAL HOLE
113 CERAMIC MEMBER
113a GAS DISCHARGE HOLE
114 SINTERED POROUS-CERAMIC BODY (POROUS-GAS PASSING BODY)
115 SLOT PLATE
116 DELAYED WAVE PLATE
117 COAXIAL WAVE GUIDE
118 METAL PLATE
119 CHANNEL FOR COOLING
120 LOWER-BERTH SHOWER PLATE
120a GAS FLOWING PATH
120b NOZZLE
120c OPENING SECTION
121 PROCESS-GAS SUPPLY PORT
122 RF POWER SUPPLY
200 LONGITUDINAL HOLE
200a FIRST LONGITUDINAL HOLE
200b SECOND LONGITUDINAL HOLE
201 SHOWER PLATE
202 COVER PLATE
203 O-RING FOR SEALS
204 GAS SUPPLY HOLE
205 SPACE
206 CERAMIC MEMBER
206a GAS DISCHARGE HOLE
207 SINTERED POROUS-CERAMIC BODY (POROUS-GAS PASSING BODY)
208 CHAMFERING PROCESSING
300 LONGITUDINAL HOLE
300a GAS DISCHARGE HOLE
300b HOLE
301 SHOWER PLATE
302 SINTERED POROUS-CERAMIC BODY (POROUS-GAS PASSING BODY)
303 CHAMFERING PROCESSING
400 SHOWER PLATE
401 SIDE HOLES
402 LONGITUDINAL HOLE
402a FIRST LONGITUDINAL HOLE
402b SECOND LONGITUDINAL HOLE
403 SINTERED POROUS-CERAMIC BODY (POROUS-GAS PASSING BODY)
404 CERAMIC MEMBER
404a GAS FLOWING HOLE
500 LONGITUDINAL HOLE
501 SHOWER PLATE

502 SINTERED POROUS-CERAMIC BODY (POROUS-GAS PASSING BODY)
502a FINE CERAMIC LAYER
502b POROSITY SECTION

What is claimed is:

1. A shower plate provided in a plasma processing apparatus to discharge gas for plasma excitation for generating plasma in a processing chamber of the plasma processing apparatus, the shower plate comprising:
   a plate having a plurality of longitudinal holes;
   a porous-gas passing body disposed in a gas inlet side of each of the plurality of longitudinal holes, which are used as a discharging path of the gas for plasma excitation; and
   a ceramic element, provided with a plurality of gas discharge holes, disposed in a gas outlet side of each of the plurality of longitudinal holes
   wherein:
   the porous-gas passing body having a pore that communicates with the ceramic element, in a gas flow direction, through the plurality of gas discharge holes, and
   an average pore diameter of a narrow path in a gas flowing path formed by the pore which passes through the porous-gas passing body is not greater than 10 μm.

2. The shower plate of claim 1, wherein the porous-gas passing body is structured by an alumina based material having a dielectric loss of not greater than $1 \times 10^{-3}$, an average diameter of a crystal not greater than 10 μm, a pore rate of 20 to 75%, an average pore diameter of not greater than 10 μm, and a bending strength of not less than 30 MPa.

3. The shower plate of claim 1, wherein an aperture of each of the plurality of gas discharge holes is not greater than two times of a sheath thickness of plasma formed directly under a shower plate, wherein the sheath thickness of plasma is the defined by:

$$D=0.606\lambda_D*(2V_0/T_e)^{3/4}$$

Wherein:
   $V_0$ is a voltage difference between plasma and a substance,
   $T_e$ is electron temperature, and
   $\lambda_D$ is Debye length defined by $7.43*10^3(T_e/n_e)^{1/2}$ where $n_e$ is an electron density of plasma.

4. The shower plate of claim 1, wherein a gas passage hole having a diameter, which is greater than an aperture of each of the plurality of gas discharge hole, is provided continuously in the gas introduction side of the porous-gas passing body.

5. The shower plate of claim 1, wherein a gas discharge hole is provided on a gas discharge side of a longitudinal hole opened in the shower plate, and chamfering processing is applied to a corner of a gas introduction side of the longitudinal hole.

6. The shower plate of claim 1, wherein an upper surface and an undersurface of the porous-gas passing body are both curving toward inside of the plasma processing apparatus in a shape of a convex curve or in a shape of a concave curve.

7. A plasma processing apparatus into which the shower plate of claim 1 is disposed.

* * * * *

UNITED STATES PATENT AND TRADEMARK OFFICE
CERTIFICATE OF CORRECTION

| | |
|---|---|
| PATENT NO. | : 8,372,200 B2 |
| APPLICATION NO. | : 12/308333 |
| DATED | : February 12, 2013 |
| INVENTOR(S) | : Masahiro Okesaku et al. |

It is certified that error appears in the above-identified patent and that said Letters Patent is hereby corrected as shown below:

In the specification, column 16, line 61, please add -- 10 -- after "of the"

Signed and Sealed this
Sixteenth Day of July, 2013

Teresa Stanek Rea
*Acting Director of the United States Patent and Trademark Office*